(12) United States Patent
Huang et al.

(10) Patent No.: US 9,627,215 B1
(45) Date of Patent: Apr. 18, 2017

(54) STRUCTURE AND METHOD FOR INTERCONNECTION

(71) Applicant: Taiwan Semiconductor Manufacturing Company, Ltd., Hsin-Chu (TW)

(72) Inventors: Chien-Hua Huang, Miaoli County (TW); Cheng-Hsiung Tsai, Miaoli County (TW); Chung-Ju Lee, Hsinchu (TW); Cherng-Shiaw Tsai, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/865,165

(22) Filed: Sep. 25, 2015

(51) Int. Cl.
| | | |
|---|---|---|
| *H01L 21/306* | (2006.01) | |
| *H01L 23/522* | (2006.01) | |
| *H01L 21/768* | (2006.01) | |
| *H01L 21/3105* | (2006.01) | |
| *H01L 21/321* | (2006.01) | |
| *H01L 21/311* | (2006.01) | |
| *H01L 21/02* | (2006.01) | |
| *H01L 23/528* | (2006.01) | |
| *H01L 23/532* | (2006.01) | |

(52) U.S. Cl.
CPC .. *H01L 21/30604* (2013.01); *H01L 21/02019* (2013.01); *H01L 21/02118* (2013.01); *H01L 21/02225* (2013.01); *H01L 21/306* (2013.01); *H01L 21/31055* (2013.01); *H01L 21/31133* (2013.01); *H01L 21/31144* (2013.01); *H01L 21/3212* (2013.01); *H01L 21/7684* (2013.01); *H01L 21/76805* (2013.01); *H01L 21/76877* (2013.01); *H01L 23/528* (2013.01); *H01L 23/5226* (2013.01); *H01L 23/5329* (2013.01)

(58) Field of Classification Search
CPC ......... H01L 21/02019; H01L 21/02225; H01L 21/02142; H01L 21/02164; H01L 21/306; H01L 21/30604
See application file for complete search history.

(56) References Cited

U.S. PATENT DOCUMENTS

| 8,039,179 B2 | 10/2011 | Shieh et al. |
| 8,202,681 B2 | 6/2012 | Lin et al. |
| 8,728,332 B2 | 5/2014 | Lin et al. |

(Continued)

FOREIGN PATENT DOCUMENTS

TW          201423908          6/2014

*Primary Examiner* — Eduardo A Rodela
(74) *Attorney, Agent, or Firm* — Haynes and Boone, LLP

(57) ABSTRACT

A method includes providing a substrate having a first conductive feature in a first dielectric material layer; forming a first etch stop layer on the first dielectric material layer, wherein the first etch stop layer is formed of a high-k dielectric material; forming a second etch stop layer on the first etch stop layer; forming a second dielectric material layer on the second etch stop layer; forming a pattered mask layer on the second dielectric material layer; forming a first trench in the second dielectric material layer and the second etch stop layer; removing a portion of the first etch stop layer through the first trench to thereby form a second trench, wherein removing the portion of the first etch stop layer includes applying a solution to the portion of the first etch stop layer; and forming a second conductive feature in the second trench.

20 Claims, 24 Drawing Sheets

(56) References Cited

U.S. PATENT DOCUMENTS

| | | |
|---|---|---|
| 8,822,243 B2 | 9/2014 | Yan et al. |
| 2004/0129967 A1* | 7/2004 | Kim ................. H01L 27/10817 257/306 |
| 2005/0140012 A1* | 6/2005 | Jung ................. H01L 21/76801 257/762 |
| 2005/0245074 A1* | 11/2005 | Jiang ................ H01L 21/76808 438/637 |
| 2006/0091468 A1 | 5/2006 | Liaw |
| 2009/0176375 A1* | 7/2009 | Benson ............. H01L 21/31116 438/719 |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0159119 A1* | 6/2014 | Derluyn ............ H01L 29/66462 257/194 |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0126030 A1* | 5/2015 | Yang ................. H01L 21/76879 438/675 |

\* cited by examiner

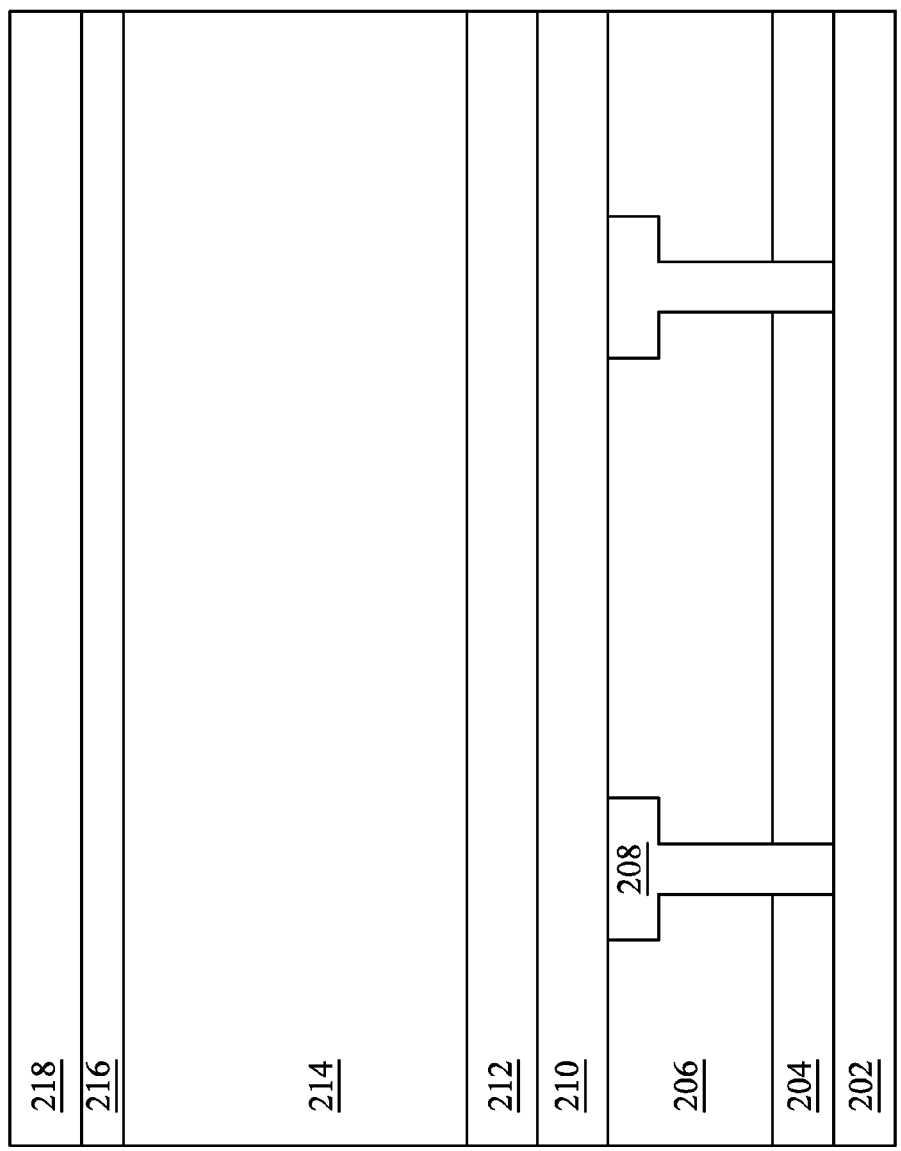

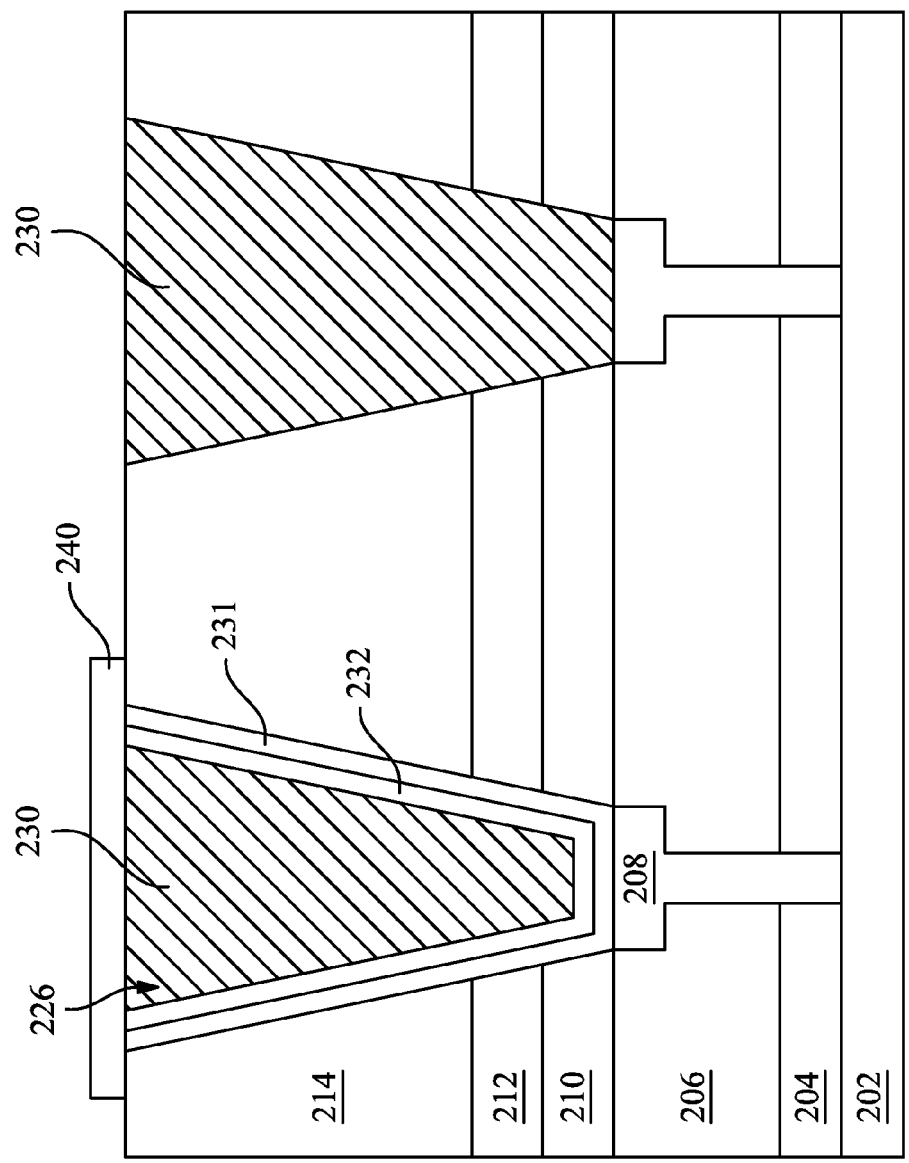

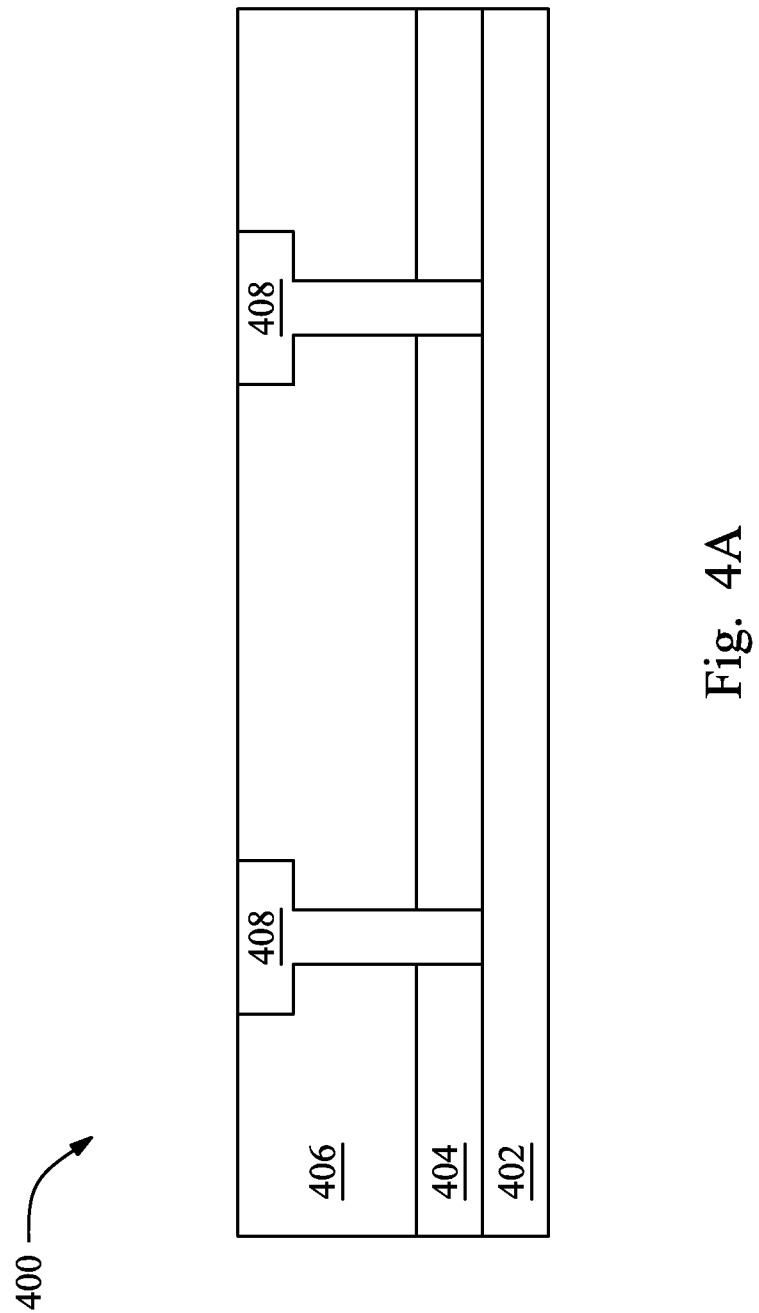

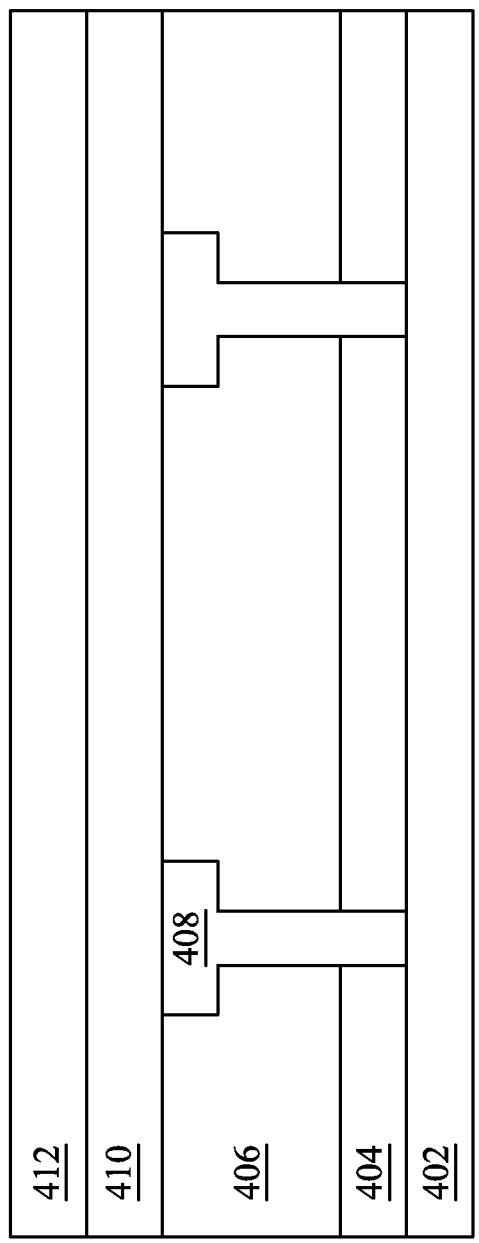

STRUCTURE AND METHOD FOR INTERCONNECTION

BACKGROUND

In semiconductor technology, an integrated circuit pattern can be defined on a substrate using a photolithography process. A damascene or a dual damascene process is utilized to form multilayer copper interconnections including vertical interconnection vias/contacts and horizontal interconnection metal lines. During a damascene process, a plug filling material is employed to fill in the vias (or contacts) and the material is then polished back. However, as semiconductor technologies move forward to advanced technology nodes with smaller feature sizes, such as 20 nm, 16 nm or less, a variety of issues with less tolerance may arise such as misalignments, damage to already formed conductive feature, etc.

Therefore, the present disclosure provides an interconnection structure and a method of making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G, 2H, 21, 2J, and 2K illustrate sectional views of an exemplary integrated circuit structure during various fabrication stages, made by the method of FIG. 1, constructed in accordance with some embodiments.

FIGS. 4A, 4B, 4C, 4D, 4E, 4F, 4G, 4H, 41, 4J, and 4K illustrate sectional views of an exemplary integrated circuit structure during various fabrication stages, made by the method of FIG. 3, constructed in accordance with some embodiments.

DETAILED DESCRIPTION

Figure 1:
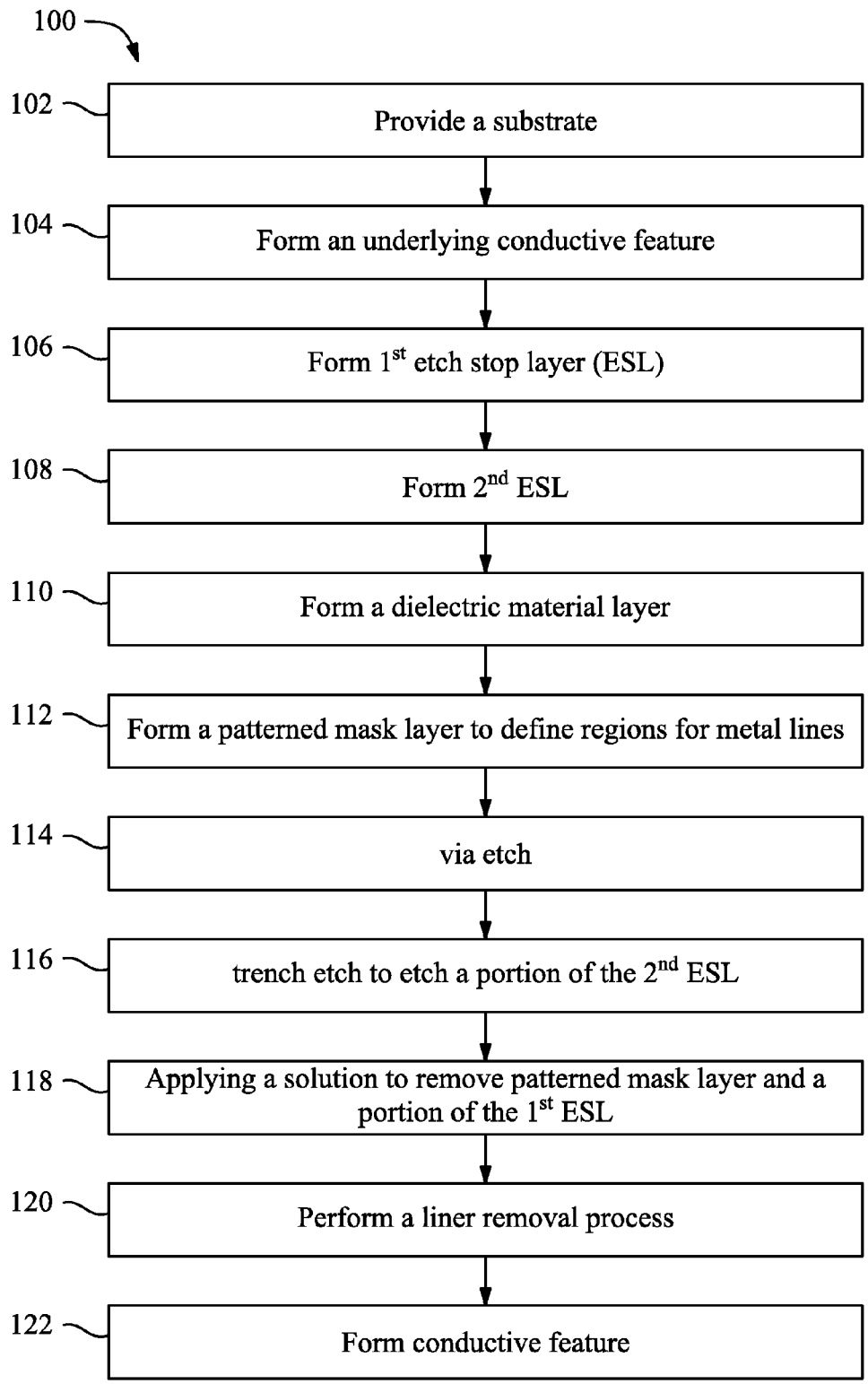
FIG. 1 is a flowchart of one embodiment of a method to form an integrated circuit (IC) structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2A:
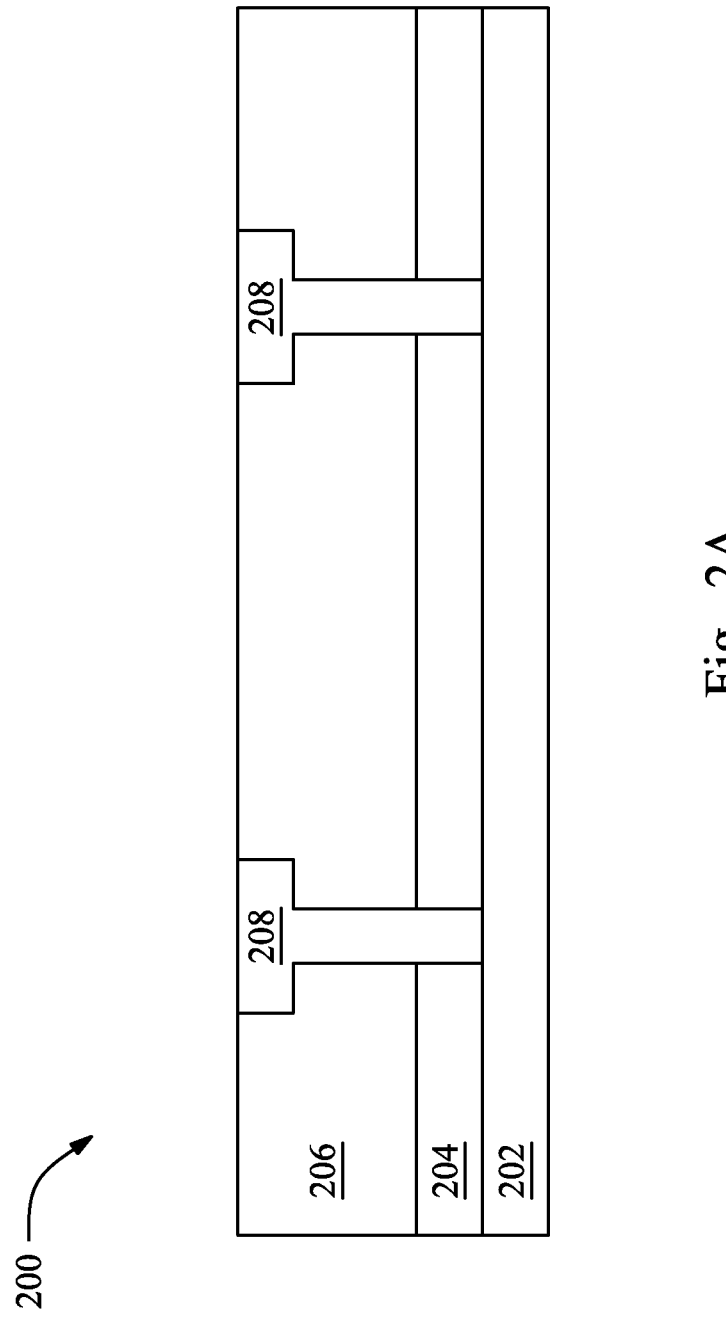

FIG. 1 is a flowchart of a method 100 to form an integrated circuit according to one or more embodiments of the present invention. FIGS. 2A, 2B, 2C, 2D, 2E, 2F, 2G, 2H, 21, 2J, and 2K illustrate sectional views of an exemplary integrated circuit 200 during various fabrication stages of the method 100. With reference to FIGS. 1 through 2K and other figures, the method 100 and the exemplary integrated circuit (IC) structure 200 are described below.

The method begins at 102 by providing or receiving a substrate 202 as illustrated in FIG. 2A. In some embodiments, the substrate 202 includes silicon. In some alternative embodiments, the substrate 202 may include other elementary semiconductor such as germanium. In some embodiments, the substrate 202 additionally or alternatively includes a compound semiconductor such as silicon carbide, gallium arsenic, indium arsenide, and indium phosphide. In some embodiments, the substrate 202 includes an alloy semiconductor such as silicon germanium, silicon germanium carbide, gallium arsenic phosphide, and gallium indium phosphide.

The substrate 202 may include an epitaxial layer formed on the top surface, such as an epitaxial semiconductor layer overlying a bulk semiconductor wafer. In some embodiments, the substrate 202 includes a semiconductor-on-insulator (SOI) structure. For example, the substrate may include a buried oxide (BOX) layer formed by a process such as separation by implanted oxygen (SIMOX). In various embodiments, the substrate 202 includes various p-type doped regions and/or n-type doped regions, such as p-type wells, n-type wells, p-type source/drain features and/or n-type source/drain features, formed by a process such as ion implantation and/or diffusion. The substrate 202 may include other functional features such as a resistor, a capacitor, diode, transistors, such as field effect transistors (FETs). The substrate 202 may include lateral isolation features configured to separate various devices formed on the substrate 202. The substrate 202 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 202. The multilayer interconnection structure is configured to couple various devices features (such as various p-type and n-type doped regions, gate electrodes and/or passive devices) to form a functional circuit.

Still referring to FIGS. 1 and 2A, the method 100 continues to operation 104 by forming one (or more) underlying conductive feature 208 on the substrate 202. In some embodiments, the underlying conductive feature 208 is a doped region, such as a source/drain feature. In some embodiments, the underlying conductive feature 208 is a gate electrode, a capacitor or resistor. In some embodiments, the underlying conductive feature 208 is a metal feature, such as a metal line, a via feature or a contact feature. In some embodiments, the underlying conductive feature 208 includes both a metal line and a via feature.

In the embodiments of the present disclosure, the underlying conductive feature 208 is a metal line in one metal layer of the MLI structure. In furtherance of the embodiment, the underlying conductive feature 208 is formed in a first dielectric material layer 206.

In some embodiments, the metal line 208 is formed by a damascene process, which is further described below. The first dielectric material layer 206 is formed on the substrate 202. Alternatively, an optional etch stop layer 204 is formed on the substrate 202 and the first dielectric material layer 206 is formed on the etch stop layer 204. In some embodiments, the first dielectric material layer 206 includes a dielectric material such as silicon oxide, silicon nitride, a low dielectric constant (low k) material, and/or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical, Midland, Mich.), polyimide, porous polymer and/or other suitable materials as examples. A process of forming the first dielectric material layer 206 may utilize chemical vapor deposition (CVD), a spin-on coating or other suitable deposition technology.

The etch stop layer 204 includes a material different from the first dielectric material layer 206 that is configured to provide etch selectivity such that a subsequent etching process is able to substantially etch the first dielectric material layer 206 and stops on the etch stop layer 204. For example, the etch stop layer 204 includes silicon nitride, silicon oxide, silicon oxynitride, silicon carbide or other suitable material that functions to stop the etching of the subsequent etching process. The etch stop layer 204 may be formed by CVD or other suitable technology.

After the deposition of (the etch stop layer 204 and) the first dielectric material layer 206, the first dielectric material layer 206 may be further planarized by a technique, such as chemical mechanical polishing (CMP). Thereafter, the first dielectric material layer 206 is patterned to form one or more trenches. The one or more trenches may be aligned to expose lower conductive features on the substrate 202 such as metal features in a lower metal layer and/or alternatively doped regions disposed in the semiconductor material of the substrate 202. In some embodiments, an operation to form the one or more trenches utilizes a lithography patterning and etching processes. For example, a patterned resist layer is formed on the first dielectric material layer 206 by a lithography process that includes resist coating, exposure and developing. The patterned resist layer includes an opening that defines a region for a given trench. An etching process is further applied to the first dielectric material layer 206 through the opening of the patterned resist layer, using the patterned resist layer as an etch mask. After the formation of the trench, the patterned resist layer is removed by wet stripping or plasma ashing. Alternatively, a hard mask may be used such that trench pattern is transferred from the patterned resist layer to the hard mask by a first etch and then transferred to the first dielectric material layer by a second etch.

A conductive material is then filled in the trench to form the underlying conductive feature 208. In various embodiments, the conductive material includes copper, aluminum, cobalt, or tungsten. In some other embodiments, the conductive material may include titanium, polysilicon, metal silicide, metal alloy, or combinations thereof. In the present embodiment, the underlying conductive feature 208 includes copper and has multiple films. In furtherance of the embodiment, the underlying conductive feature 208 includes a barrier layer lining the trench and copper filled in the trench. In one example, the underlying conductive feature 208 is formed by a procedure that includes depositing a barrier layer on sidewalls of the trench; forming a copper seed layer by sputtering; and filling the bulk copper in the trench by plating. The barrier layer may include titanium, titanium nitride, tantalum, tantalum nitride and/or a combination thereof; and may be formed by sputtering. Afterward, a CMP process may be applied to remove excessive copper and planarize the top surface.

Figure 2B:
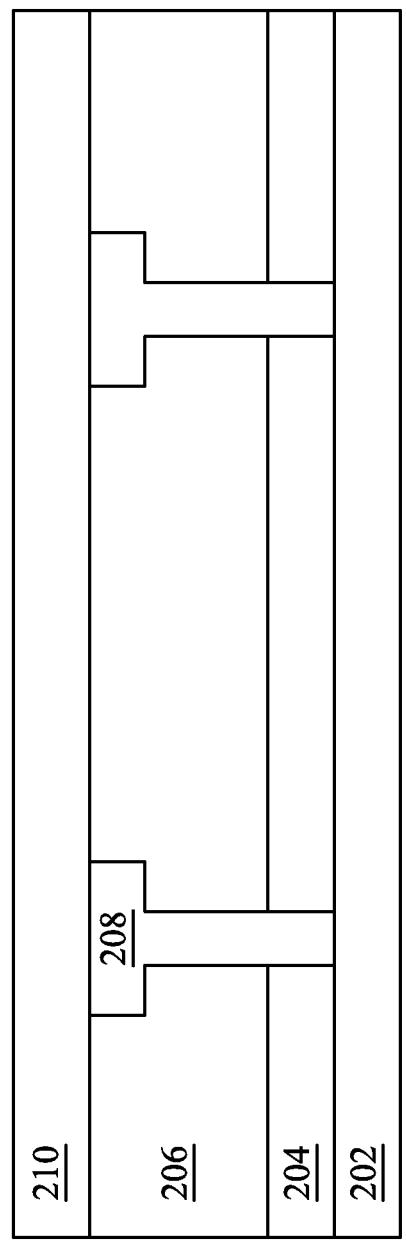

Referring to FIGS. 1 and 2B, method 100 proceeds to operation 106 with forming a first etch stop layer (ESL) 210 over the conductive feature 208 and the first dielectric material layer 206. In some embodiments, the first ESL 210 is formed of a material that is different from etch stop layer 204. For example, first ESL 210 may be formed of a high-k dielectric material such as AlON, AlN, AlO, HfO, TiO, TiAlO, $Ta_2O_5$, and/or combination thereof. A process of forming the first ESL 210 may include utilizing chemical vapor deposition (CVD), a spin-on coating, atomic layer deposition (ALD), and/or other deposition technology. In some embodiments, the first ESL 210 may have a thickness that is less than about 50 angstroms.

Figure 2C:
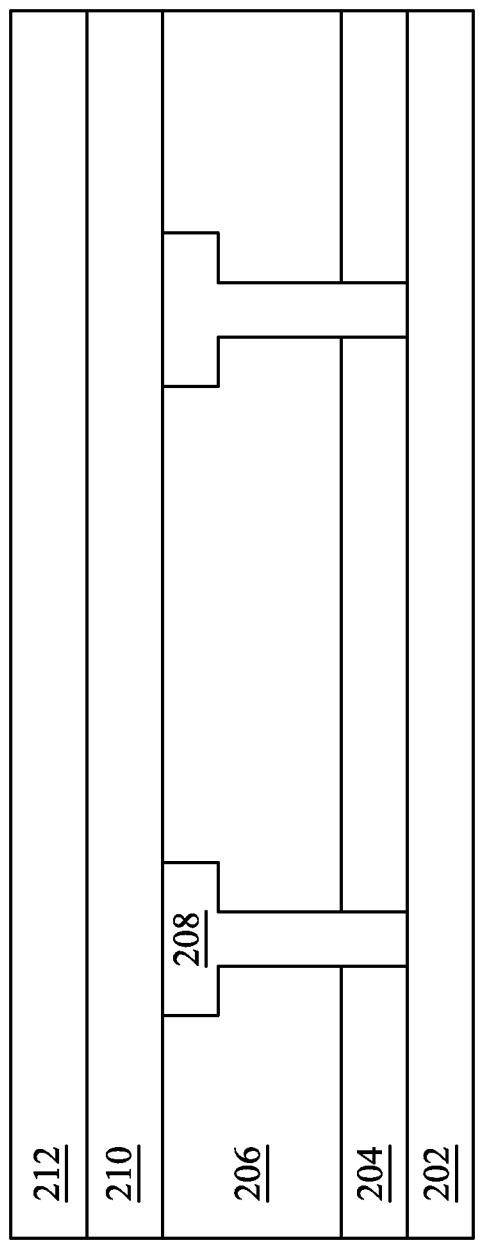

Referring to FIGS. 1 and 2C, method 100 then proceeds to operation 108 with forming a second etch stop layer (ESL) 212 over the first etch stop layer 210. In some embodiments, the second ESL 212 is formed of a material that is different from the first ESL 210. For example, second ESL 212 may be formed of a dielectric material such as silicon oxide, silicon nitride, silicon carbide, silicon oxynitride, silicon carbon nitride, and/or a combination thereof. A process of forming the second ESL 212 may include utilizing chemical vapor deposition (CVD), a spin-on coating, atomic layer deposition (ALD), and/or other deposition technology. In some embodiments, the second ESL 212 may have a thickness that is less than about 50 angstroms. The first and second ESLs 210 and 212 are designed to provide etch selectivity during subsequent etching that is different from that of a dielectric material layer (e.g., layer 214 in FIG. 2D discussed below which is formed on the second ESL 212).

Figure 2D:
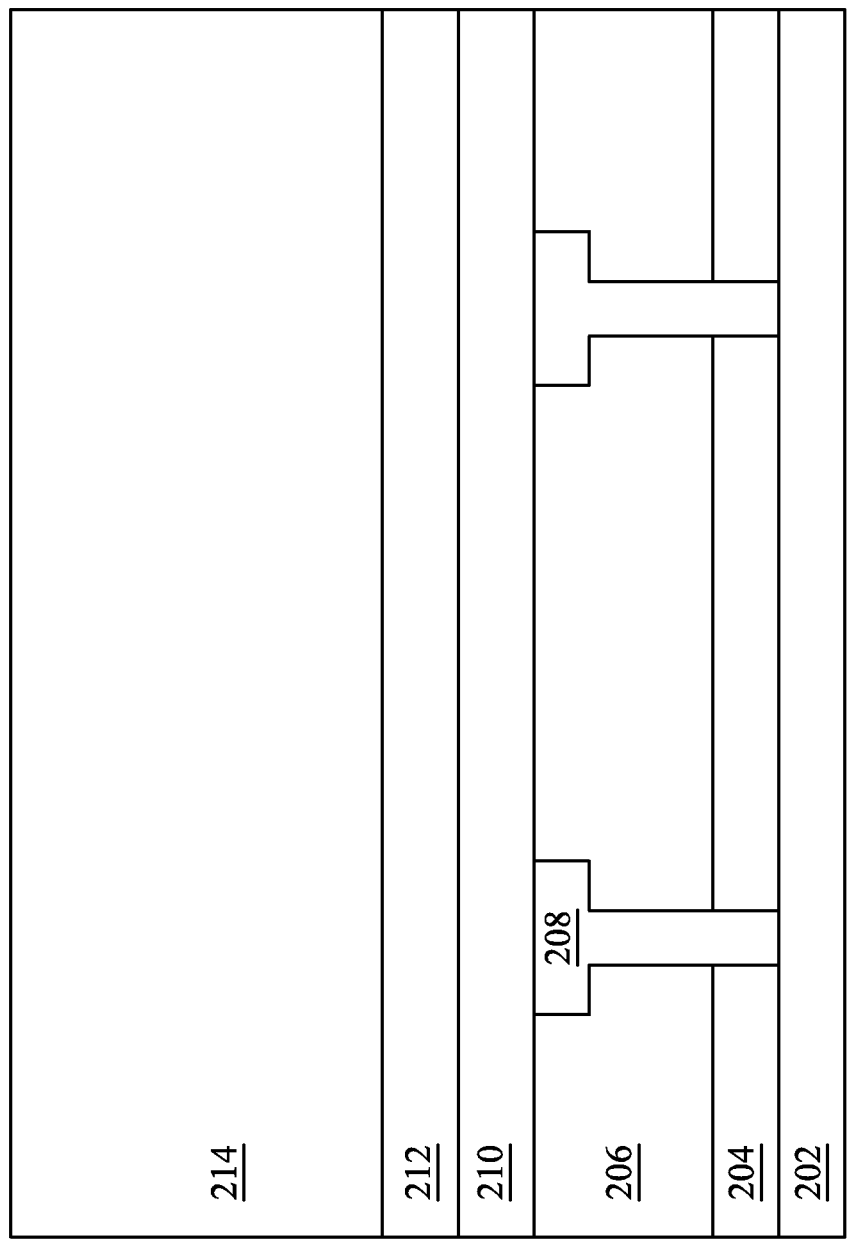

Referring to FIGS. 1 and 2D, method 100 continues to operation 110 with forming a second dielectric material layer 214 over the second ESL 212. In some embodiments, the second dielectric material layer 214 includes silicon oxide, silicon nitride, a low k material, and/or a combination thereof. The formation of the second dielectric material layer 214 may include CVD, a spin-on coating and/or other deposition technology. In some embodiments, the second dielectric material layer 214 is the same as the first dielectric material layer 206 in terms of composition. Alternatively, in other embodiments the second dielectric material layer 214 is different than the first dielectric material layer 206 in terms of composition. After the deposition of the second dielectric material layer 214, a CMP process may be applied to planarize the top surface of the IC structure 200.

In some embodiments, an anti-reflective coating (ARC) film 216 is further formed on the second dielectric material layer 214 to reduce the reflection during subsequent lithography patterning or additionally provide other functions. In one example, the ARC film 216 includes a nitrogen-free ARC (NFARC) material. NFARC material reduces resist poisoning in sensitive photoresists and may include silicon oxide and may additionally include carbon, such as carbon-doped silicon oxide.

A mask layer 218 is further formed on the IC structure 200. In some embodiments, the mask layer 218 is a resist layer. In some other embodiments, the mask layer 218 includes a hard mask material, such as titanium nitride, titanium oxide, tantalum nitride, aluminum oxynitride, and/or aluminum nitride.

Figure 2F:
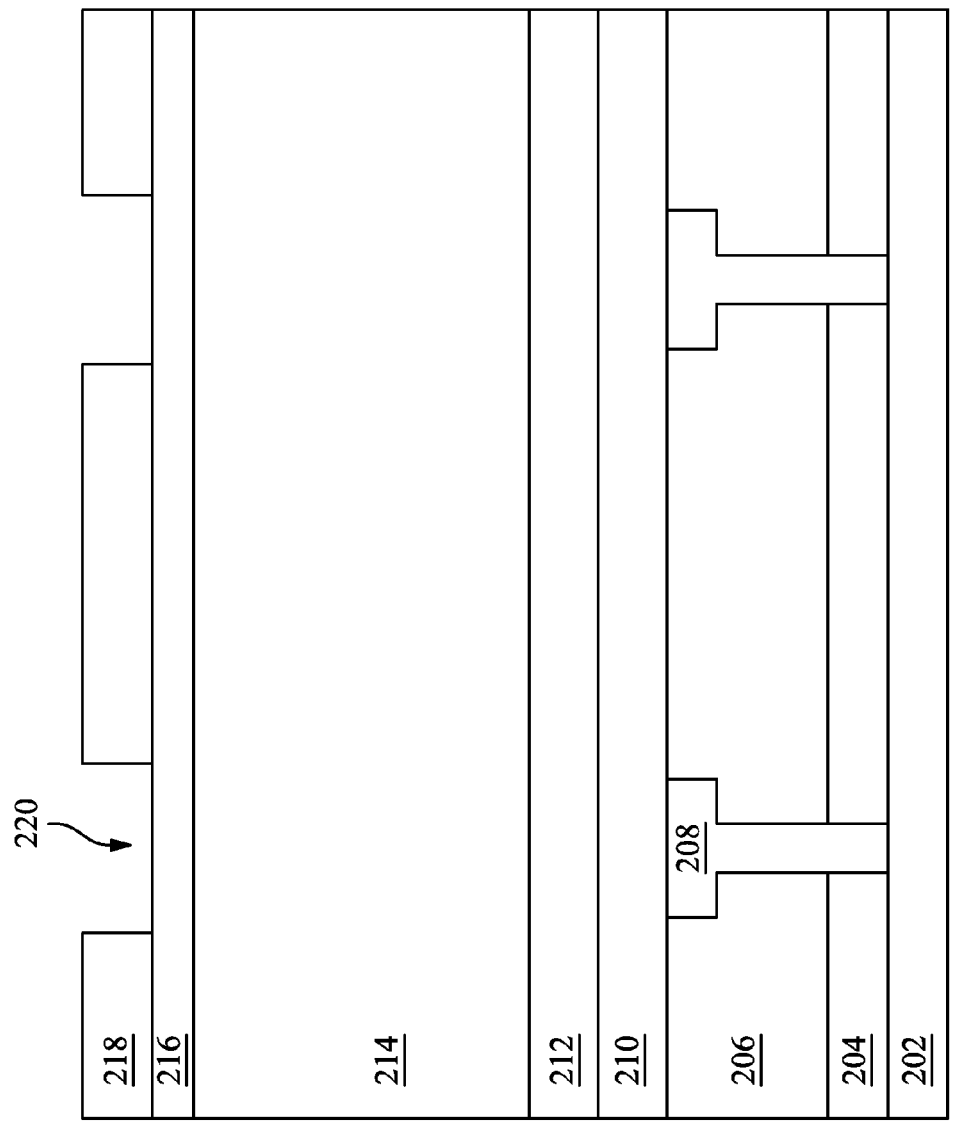

Referring to FIGS. 1 and 2F, method 100 proceeds to operation 112 to pattern the mask layer 218, thereby forming a patterned mask layer 218 having openings 220 that define regions for metal lines to be formed in a later processing step. In some embodiments, the mask layer 218 is a resist layer, the patterning process in the operation 112 is a lithography procedure that includes spin-on coating, exposure and developing. In some embodiments, the mask layer 218 is a hard mask, the patterning process in the operation 112 includes forming a patterned resist layer on the hard mask 218 using a lithography process; and etching the hard mask through the opening of the patterned resist layer using the patterned resist layer as an etch mask. After the formation of the patterned hard mask 218, the patterned resist layer may be removed by plasma ashing or wet stripping.

Figure 2G:
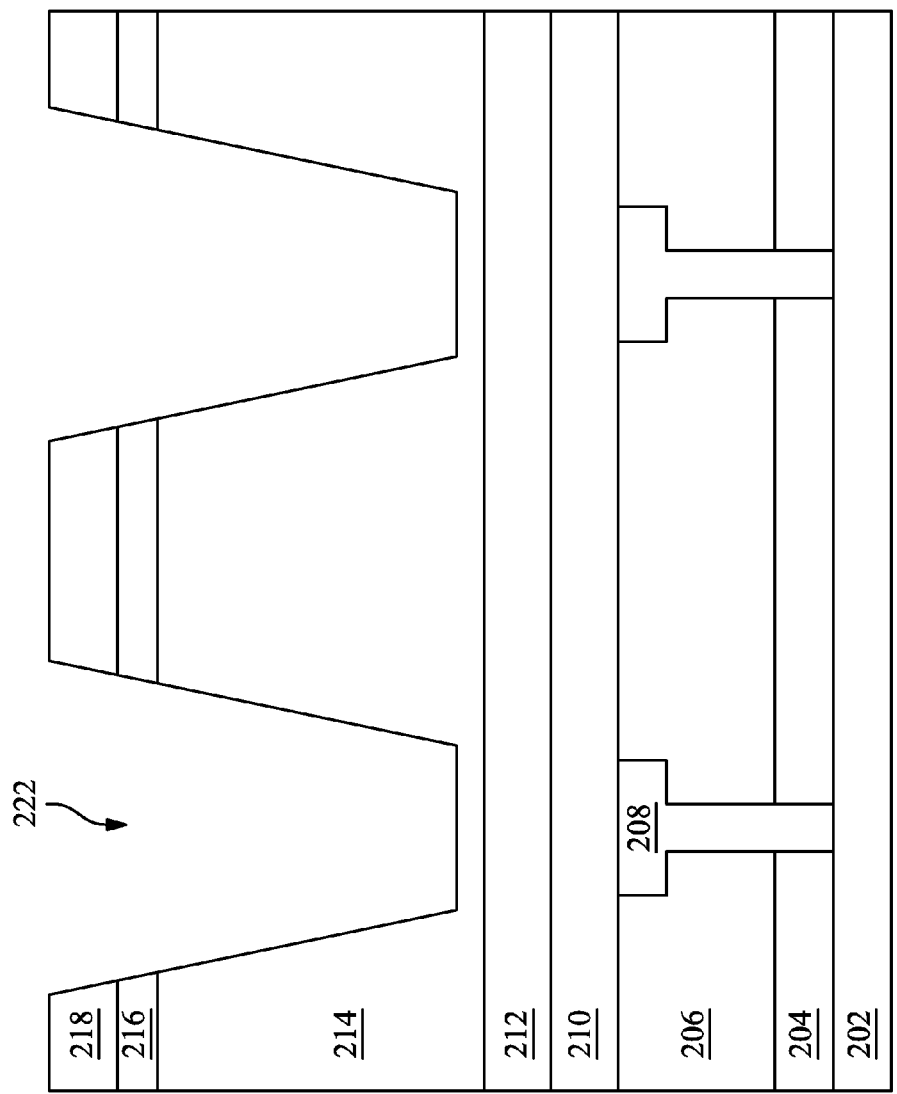

Referring to FIGS. 1 and 2G, method 100 proceeds to operation 114 where a via etching process is performed. The second dielectric material layer 214 and the ARC layer 216 is etched (or recessed) through openings 220 to form first trenches 222 (or opening features) that extend through patterned mask layer 218, the ARC layer 216, and the second dielectric material layer 214. First trenches 222 are formed by performing a first etching process using the patterned resist layer 218 as an etch mask. The first etching process is designed and tuned to partially etch the second dielectric material layer 214 such that the first trenches 222 do not extend completely through the second dielectric material layer 214. For example, the second dielectric material layer 214 is etched to about half of its thickness. In some embodiments, the first etching process is controlled by the etching duration.

Figure 2H:
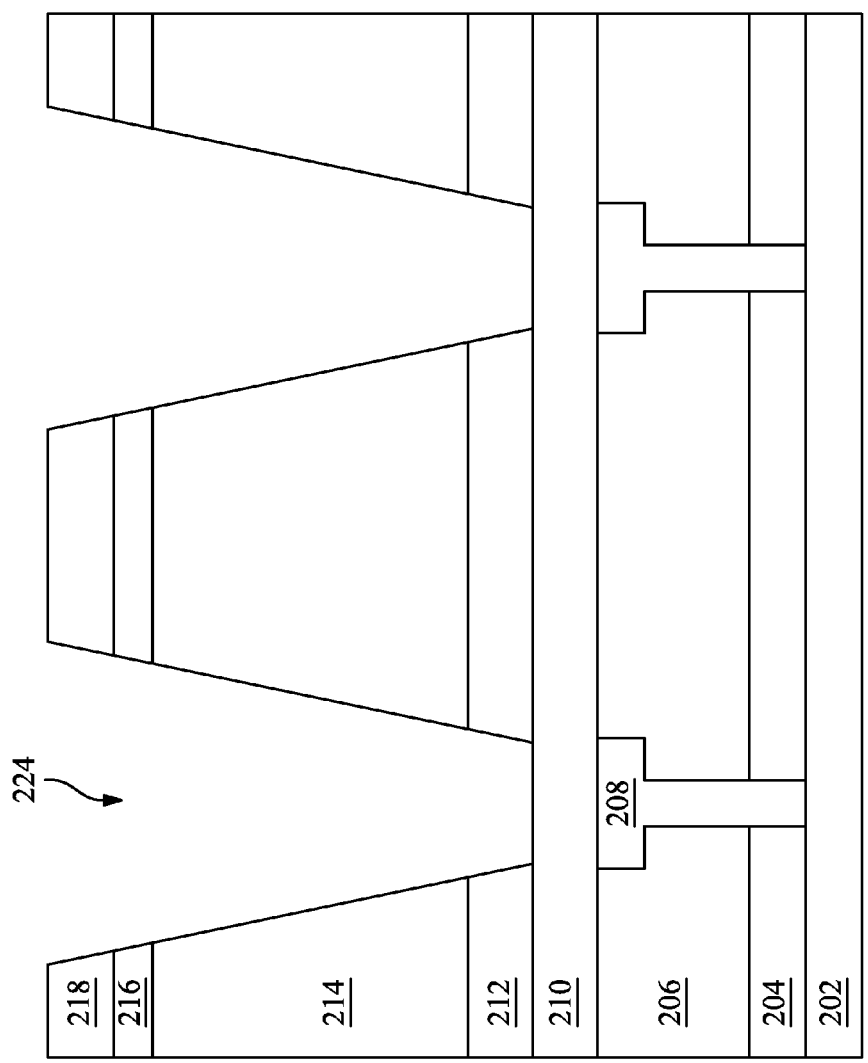

Referring to FIG. 2H, method 100 proceeds to operation 116 where a trench etching process is performed. The second dielectric material layer 214, the ARC layer 216, and the second ESL 212 are further etched through the opening 220 by a second etching process using the hard mask 218 as an etch mask. As a result of this second etching process, first trenches 222 are enlarged to form second trenches 224. The second etching process is designed to selectively etch the second dielectric material layer 214 and the second ESL 212 while the first ESL 210 substantially remains intact.

In some embodiments, the second etching process includes dry etch, wet etch and/or a combination thereof. The second etching process is designed with an etchant to have etching selectivity such that the second etching process substantially removes the second dielectric material layer 214 and the second ESL 212 while keeping the first ESL 210 intact. In some embodiments, the second etching process is a dry etch with more etching directionality. In some embodiments, the etchant in the second etching process includes fluorine-containing gas (such as CxFy, which x and y are proper integers), oxygen-containing gas (such as O2), other suitable etching gas and/or a combination thereof.

After the formation of second trench 224, method 100 proceeds to operation 118 with applying a third etching process to etch the first ESL 210 exposed by second trench 224 to form a third trench 226. More specifically, the third etching process may include applying a solution to the IC structure 200 that simultaneously removes the patterned mask layer 218, etches the first ESL 210, and forms a protective layer 228 over the underlying conductive feature 208. The solution includes a first component, a second component, and a third component. In some embodiments, the first component includes: Triethanolamine hydrochloride, Triethanolamine, Trolamine, Trolamine salicylate, 2-Chloroethyl vinyl ether, 2-[4-(Dimethylamino)phenyl] ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, and/or 1-Acetylguanidine; the second component includes: Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol)bis(amine), (2-Methylbutyl) amine, Tris(2-ethylhexyl)amine, (4-Isothiocyanatophenyl) (3-methylphenyl)amine, and/or Poly(ethylene glycol) methyl ether amine, Poly(ethylene glycol)diamin; the third component includes: 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, and/or BTA-like. In some specific embodiments, the first component is configured to etch the first ESL layer 210 and/or the patterned mask layer 218; the second component is configured to remove residues distributed along sidewall(s) of second trench 224; and the third component is configured to form the protective layer 228.

As such, using the solution in forming the third trench 226 offer a variety of advantages over conventional approaches. In an example, during a conventional formation of a trench (or opening feature) through one or more ESL layers may involve at least two individual etching processes: a first etching process to etch the ESL layer(s) (e.g., the first and the second ESLs 210 and 212) and a second etching process to remove a patterned mask layer (e.g., 218). Conventionally, since the first ESL and the second ESL are formed of a substantially similar material or include a substantially similar etching selectivity, the first etching process may cause damage directly to an underlying conductive feature (e.g., 208). Moreover, since the underlying conductive feature is exposed after the first etching process, the second etching process generally includes a wet etching process may cause further damage to the underlying conductive feature.

In stark contrast, after the second trench 224 has been formed by the second etching process, the underlying conductive feature is still covered/protected by the first ESL 210. Moreover, even though the third etching process selectively etches the first ESL layer 210 the process still involves the etching solution simultaneously forming protective layer 228 over the exposed underlying conductive feature 208 to prevent the conductive feature from any damage. The formed protective layer 228 may be further configured to protect the conductive feature 208 from one or more subsequent etching processes, which will be discussed as follows. Still further, the patterned mask layer 218 is simultaneously removed during the third etching process, which conventionally performed in a different etching process.

Figure 2I:
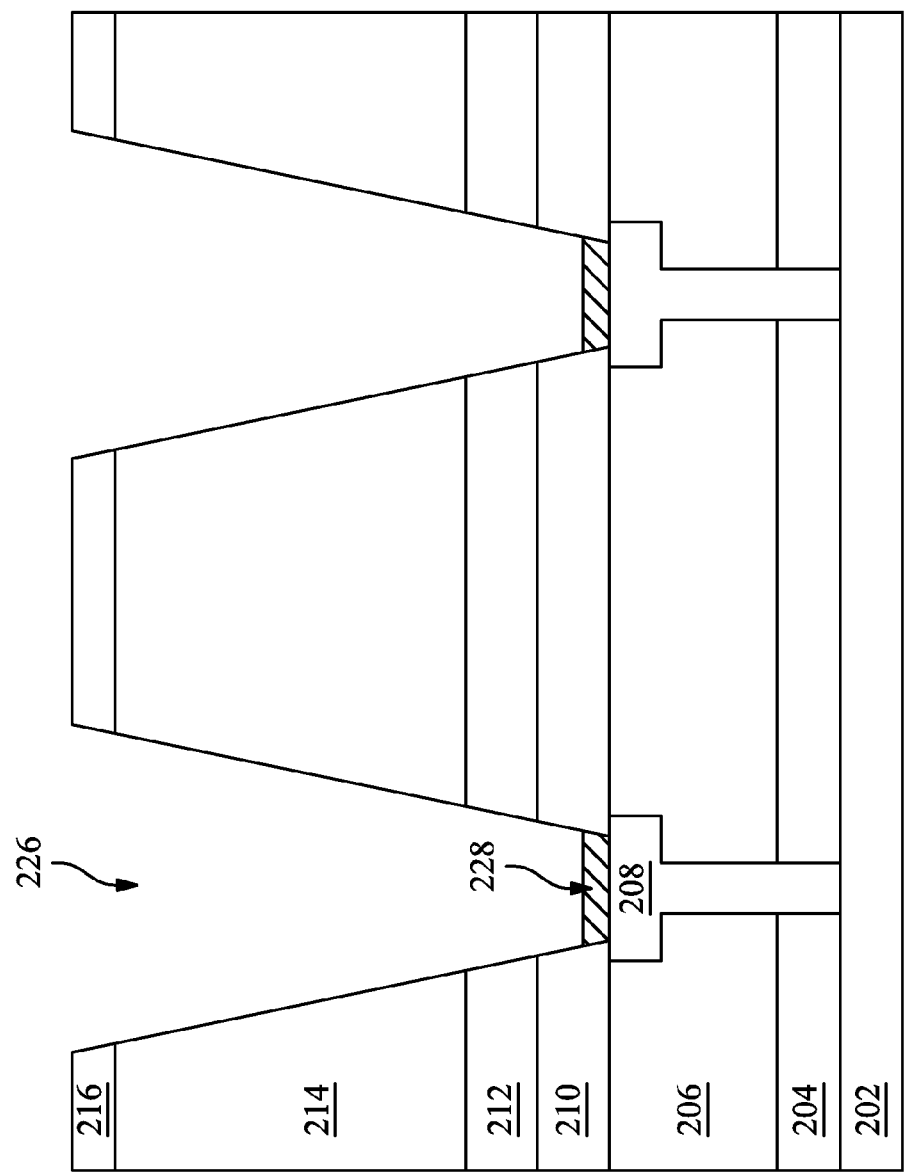
Figure 2J:
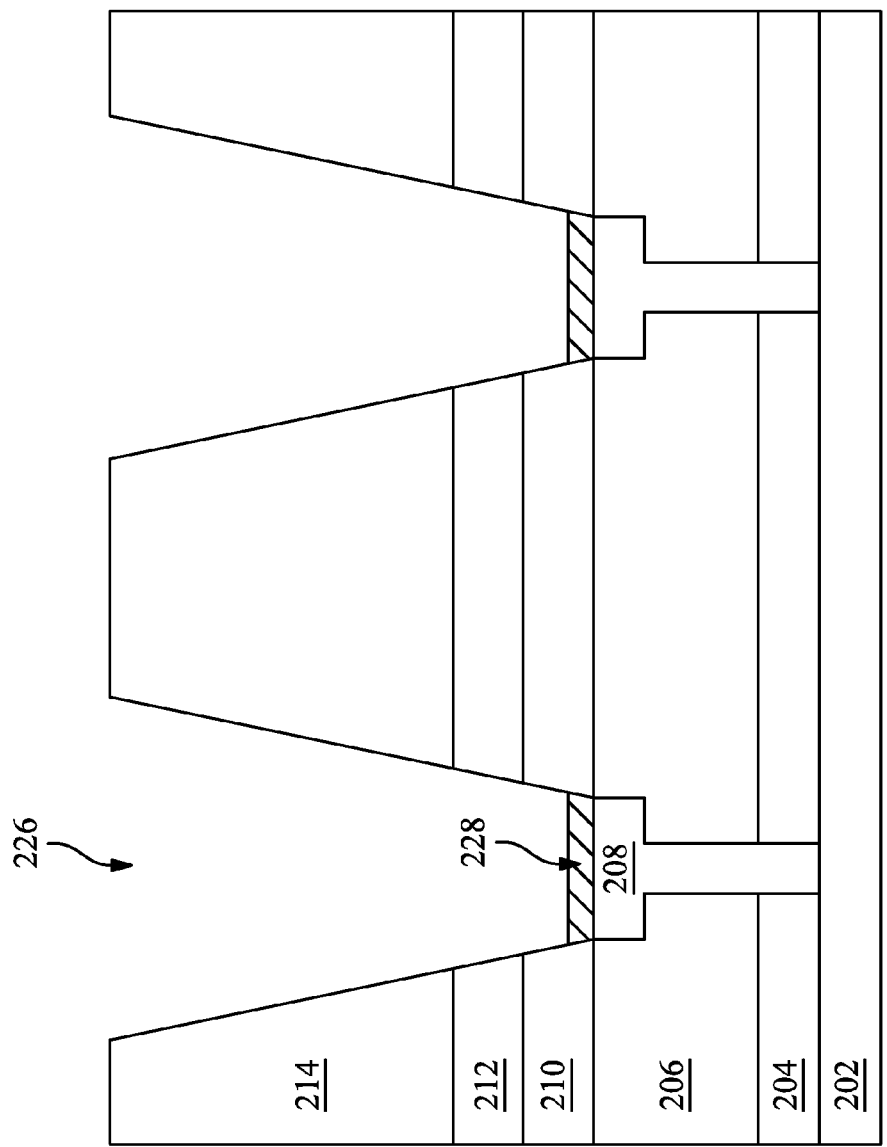

Referring now to FIGS. 1 and 2J, method 100 proceeds to operation 120 with performing a fourth etching process to remove the ARC layer 216. In some specific embodiments, the fourth etching process may be referred to as a "liner removal process." Generally, the fourth etching process may include a dry etching process that includes using a fluorine-containing gas, oxygen-containing gas, and/or a combination thereof as an etchant. In some alternative embodiments, the fourth etching process may include a wet stripping and/or plasma ashing process. As described above, since the protective layer 228 is formed to cover/protect the exposed underlying conductive feature 208 (as shown in FIGS. 2I and 2J), the fourth etching process is prevented from causing damage to the underlying conductive feature 208.

Referring to FIGS. 1 and 2K, method 100 proceeds to operation 122 with forming a conductive feature 230 in the third trench 226. In some embodiments, the conductive feature 230 may include a via and/or a trench that is configured to electrically couple a subsequently formed conductive feature 240 (e.g., a metal line, a contact, an interconnect layer, etc.) to the underlying conductive feature 208. In various embodiments, the conductive feature 230 is formed of a conductive material that includes copper, aluminum, cobalt and/or tungsten. In some other embodiments, the conductive material may include titanium, polysilicon, metal silicide, metal alloy, and/or combinations thereof. In some embodiments, the conductive feature 230 is the same as the underlying conductive feature 208 in terms of composition and formation. In other alternative embodiments, the conductive feature 230 is different than the underlying conductive feature 208 in terms of composition and formation.

In the present embodiment, the conductive feature 230 includes copper and has multiple films. In one example, the conductive feature 230 is formed by a procedure that includes: removing the protective layer 228; depositing a barrier layer 231 on sidewalls of the third trench 226; forming a copper seed layer 232 by sputtering; and filling the copper material (e.g., 230) in the remaining portion of third trench 226 by plating. The removing the protective layer 228 may include applying IPA, DMSO, DMF, diluted HCl, $NH_4OH$, diluted HF, or a combination thereof. The barrier layer may include titanium, titanium nitride, tantalum, tantalum nitride, other suitable material, or a combination thereof; and may be formed by sputtering. Afterward, a CMP process may be applied to remove excessive copper and planarize the top surface before forming the conductive feature 240.

Figure 3:
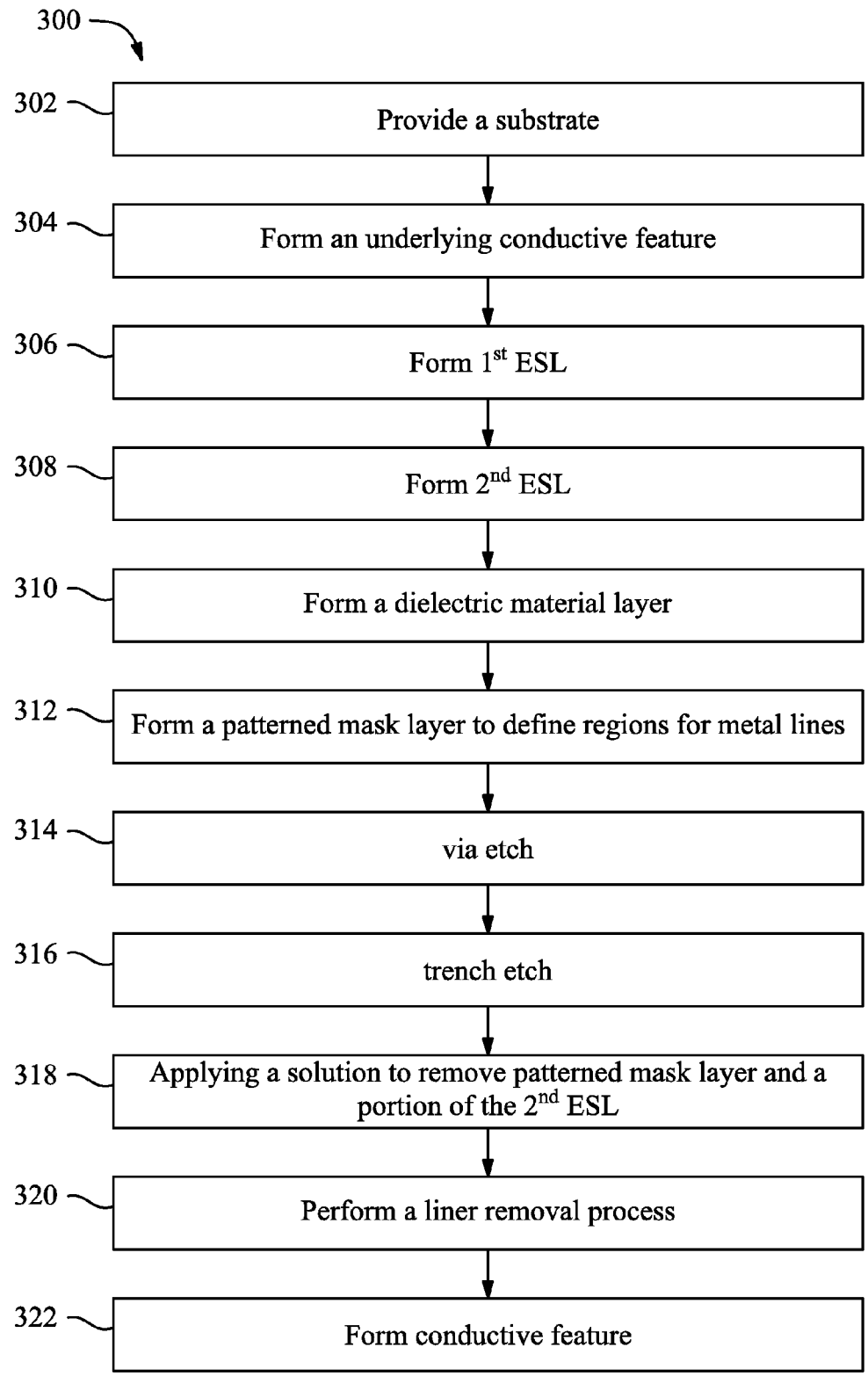
FIG. 3 is a flowchart of one embodiment of a method to form an integrated circuit (IC) structure, in accordance with some embodiments.

FIG. 3 is a flowchart of a method 300 to form an integrated circuit according to one or more embodiments of the present invention. FIGS. 4A, 4B, 4C, 4D, 4E, 4F, 4G, 4H, 4I, 4J, and 4K illustrate sectional views of an exemplary integrated circuit 400 during various fabrication stages of the method 300. With reference to FIGS. 1 through 4K and other figures, the method 300 and the exemplary integrated circuit (IC) structure 400 are described below.

The method 300 begins at 302 by providing or receiving a substrate 402 as illustrated in FIG. 4A. In some embodiments, the substrate 402 includes silicon. In some alternative embodiments, the substrate 402 may include other elementary semiconductor such as germanium. In some embodiments, the substrate 402 additionally or alternatively includes a compound semiconductor such as silicon carbide, gallium arsenic, indium arsenide, and indium phosphide. In some embodiments, the substrate 402 includes an alloy semiconductor such as silicon germanium, silicon germanium carbide, gallium arsenic phosphide, and gallium indium phosphide.

The substrate 402 may include an epitaxial layer formed on the top surface, such as an epitaxial semiconductor layer overlying a bulk semiconductor wafer. In some embodiments, the substrate 402 includes a semiconductor-on-insulator (SOI) structure. For example, the substrate may include a buried oxide (BOX) layer formed by a process such as separation by implanted oxygen (SIMOX). In various embodiments, the substrate 402 includes various p-type doped regions and/or n-type doped regions, such as p-type wells, n-type wells, p-type source/drain features and/or n-type source/drain features, formed by a process such as ion implantation and/or diffusion. The substrate 402 may include other functional features such as a resistor, a capacitor, diode, transistors, such as field effect transistors (FETs). The substrate 402 may include lateral isolation features configured to separate various devices formed on the substrate 402. The substrate 402 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 402. The multilayer interconnection structure is configured to couple various devices features (such as various p-type and n-type doped regions, gate electrodes and/or passive devices) to form a functional circuit.

Still referring to FIGS. 3 and 4A, the method 300 continues to operation 304 by forming one (or more) underlying conductive features 408 on the substrate 402. In some embodiments, the underlying conductive feature 408 is a doped region, such as a source/drain feature. In some embodiments, the underlying conductive feature 408 is a gate electrode, a capacitor or resistor. In some embodiments, the underlying conductive feature 408 is a metal feature, such as a metal line, a via feature or a contact feature. In some embodiments, the underlying conductive feature 408 includes both a metal line and a via feature.

In the embodiments of the present disclosure, the underlying conductive feature 408 is a metal line in one metal layer of the MLI structure. In furtherance of the embodiment, the underlying conductive feature 408 is formed in a first dielectric material layer 406.

In some embodiments, the metal line 408 is formed by a damascene process, which is further described below. The first dielectric material layer 406 is formed on the substrate 402. Alternatively, an optional etch stop layer 404 is formed on the substrate 402 and the first dielectric material layer 406 is formed on the etch stop layer 404. In some embodiments, the first dielectric material layer 406 includes a dielectric material such as silicon oxide, silicon nitride, a low dielectric constant (low k) material, and/or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical, Midland, Mich.), polyimide, porous polymer and/or other suitable materials as examples. A process of forming the first dielectric material layer 406 may utilize chemical vapor deposition (CVD), a spin-on coating or other suitable deposition technology. The etch stop layer 404 includes a material different from the first dielectric material layer 406 that is configured to provide etch selectivity such that a subsequent etching process is able to substantially etch the first dielectric material layer 406 and stops on the etch stop layer 404. For example, the etch stop layer 404 includes silicon nitride, silicon oxide, silicon oxynitride, silicon carbide or other suitable material that functions to stop the etching of the subsequent etching process. The etch stop layer 404 may be formed by CVD and/or other technology.

After the deposition of the etch stop layer 404 and the first dielectric material layer 406, the first dielectric material layer 406 may be further planarized by a technique, such as chemical mechanical polishing (CMP). Thereafter, the first dielectric material layer 406 is patterned to form one or more trench. The trench may be aligned to expose lower conductive features in/on the substrate 402 such as metal features in a lower metal layer or alternatively doped regions disposed in the semiconductor material of the substrate 402. In some embodiments, an operation to form the trench utilizes a lithography patterning and etching processes. For example, a patterned resist layer is formed on the first dielectric material layer 406 by a lithography process that includes resist coating, exposure and developing. The patterned resist layer includes an opening that defines a region for the trench. An etching process is further applied to the first dielectric material layer 406 through the opening of the patterned resist layer, using the patterned resist layer as an etch mask. After the formation of the trench, the patterned resist layer is removed by wet stripping and/or plasma ashing. Alternatively, a hard mask may be used such that the trench pattern is transferred from the patterned resist layer to the hard mask by a first etch and then transferred to the first dielectric material layer by a second etch.

A conductive material is then filled in the trench to form the underlying conductive feature 408. In various embodiments, the conductive material includes copper, aluminum, cobalt, and/or tungsten. In some other embodiments, the conductive material may include titanium, polysilicon, metal silicide, metal alloy, and/or combinations thereof. In the present embodiment, the underlying conductive feature 408 includes copper and has multiple films. In furtherance of the embodiment, the underlying conductive feature 408 includes a barrier layer lining the trench and copper filled in the trench. In one example, the underlying conductive feature 408 is formed by a procedure that includes depositing a barrier layer on sidewalls of the trench; forming a copper seed layer by sputtering; and filling the bulk copper in the trench by plating. The barrier layer may include titanium, titanium nitride, tantalum, tantalum nitride or a combination thereof; and may be formed by sputtering. Afterward, a CMP process may be applied to remove excessive copper and planarize the top surface.

Figure 4B:
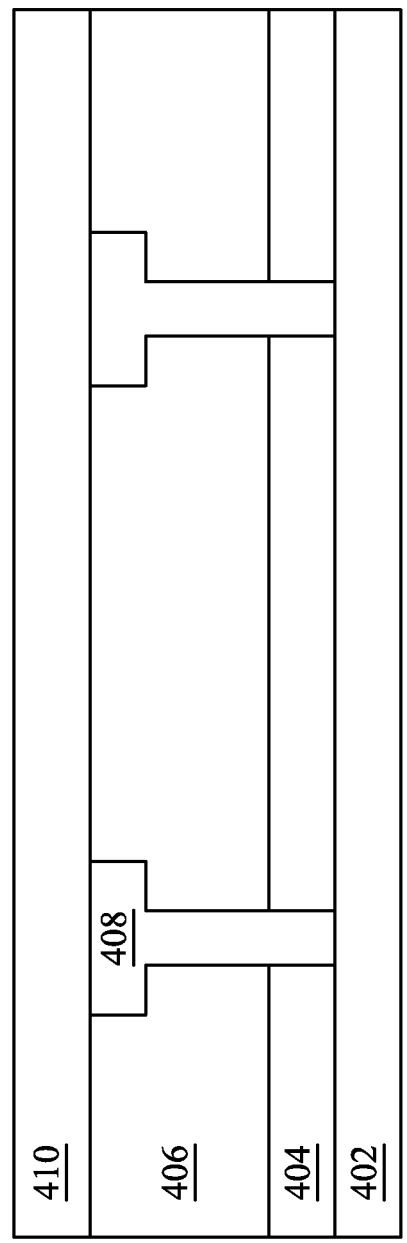

Referring to FIGS. 3 and 4B, method 300 proceeds to operation 306 with forming a first etch stop layer (ESL) 410 over the conductive feature 408 and the first dielectric material layer 406. In some embodiments, the first ESL 410 is formed of a dielectric material that includes silicon oxide, silicon nitride, silicon carbide, silicon oxynitride, silicon carbon nitride, and/or a combination thereof. A process of forming the first ESL 410 may include utilizing chemical vapor deposition (CVD), a spin-on coating, atomiclayer deposition (ALD), and/or other deposition technology. In some embodiments, the first ESL 410 may have a thickness that is less than about 50 angstroms.

Referring to FIGS. 3 and 4C, method 300 then proceeds to operation 308 with forming a second etch stop layer (ESL) 412 over the first etch stop layer 410. In some embodiments, the second ESL 412 is formed of a material that is different from the first ESL 410 and that includes a high-k dielectric material such as, for example, AlON, AlN, AlO, HfO, TiO, TiAlO, $Ta_2O_5$, and/or combination thereof. A process of forming the second ESL 412 may include utilizing chemical vapor deposition (CVD), a spin-on coating and/or other deposition technology. In some embodiments, the second ESL 412 may have a thickness that is less than about 50 angstroms. The first and second ESLs 410 and 412 are designed to provide etch selectivity during subsequent etching that is different from that of a dielectric material layer (e.g., layer 414 in FIG. 4D, discussed below which is formed on the second ESL 412)

Figure 4D:
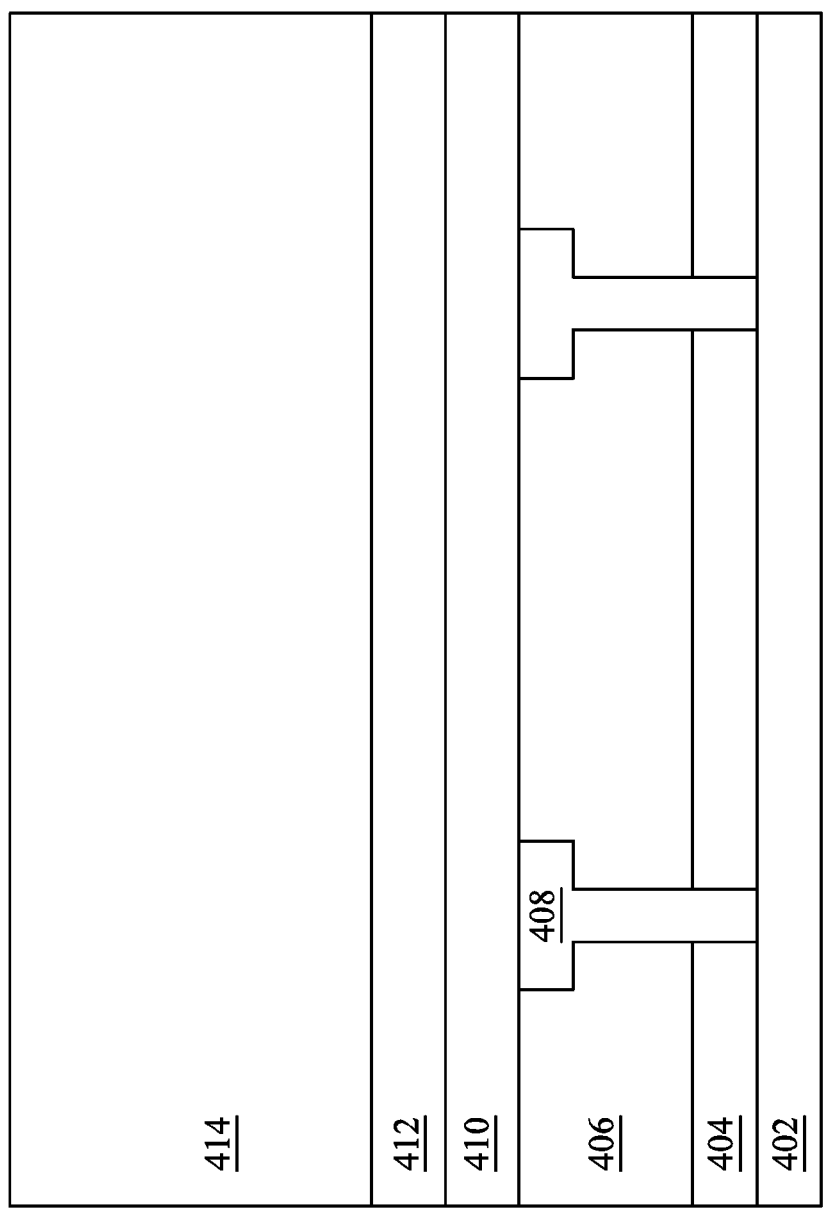

Referring to FIGS. 3 and 4D, method 300 continues to operation 310 with forming a second dielectric material layer 414 over the second ESL 412. In some embodiments, the second dielectric material layer 414 includes silicon oxide, silicon nitride, a low k material, and/or a combination thereof. The formation of the second dielectric material layer 414 may include CVD, a spin-on coating, atomic layer deposition (ALD), and/or other deposition technology. In some embodiments, the second dielectric material layer 414 is the same as first dielectric material layer 406 in terms of composition. Alternatively, in other embodiments the second dielectric material layer 414 is different than the first dielectric material layer 406 in terms of composition. After the deposition of the second dielectric material layer 414, a CMP process may be applied to planarize the top surface of the IC structure 400.

Figure 4E:
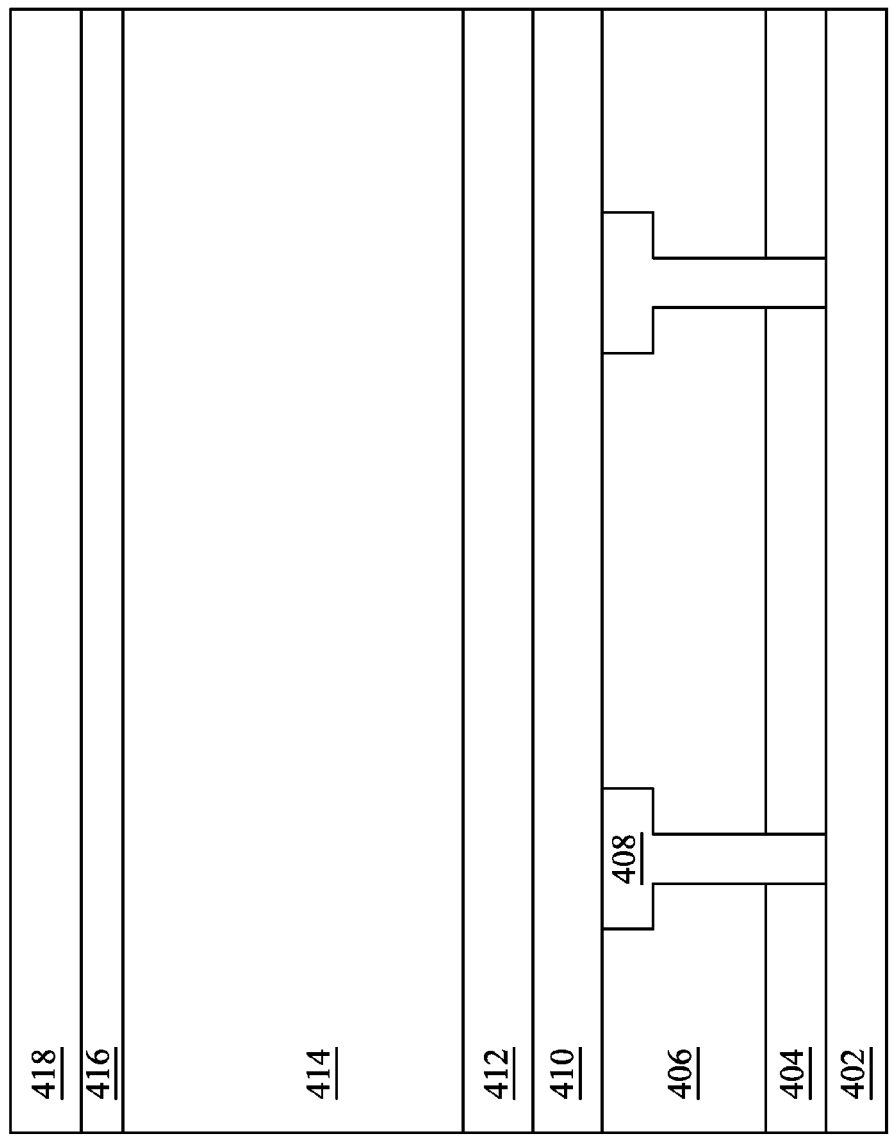

In some embodiments, as shown in FIG. 4E, an anti-reflective coating (ARC) film 416 is further formed on the second dielectric material layer 414 to reduce the reflection during subsequent lithography patterning or additionally provide other functions. In one example, the ARC film 416 includes a nitrogen-free ARC (NFARC) material. NFARC material reduces resist poisoning in sensitive photoresists and may include silicon oxide and may additionally include carbon, such as carbon-doped silicon oxide.

Still referring to FIG. 4E, a mask layer 418 is further formed on the IC structure 400. In some embodiments, the mask layer 418 is a resist layer. In some other embodiments, the mask layer 418 includes a hard mask material, such as titanium nitride, titanium oxide, tantalum nitride, aluminum oxynitride, aluminum nitride, and/or combination thereof.

Figure 4F:
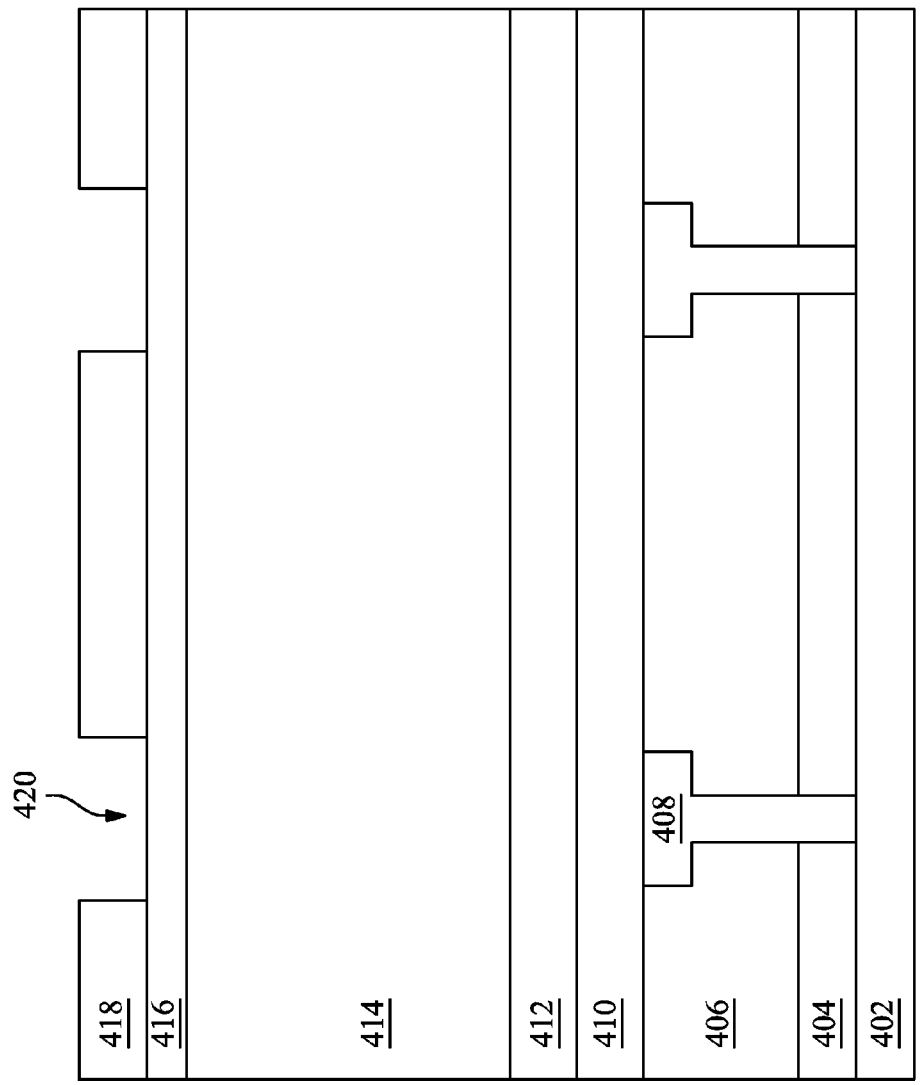

Referring to FIGS. 3 and 4F, method 300 proceeds to operation 312 to pattern the mask layer 418, thereby forming a patterned mask layer 418 having openings 420 that define regions for a conductive feature (e.g., metal line(s)). In some embodiments, the mask layer 418 is a resist layer, the patterning process in the operation 312 is a lithography procedure that includes spin-on coating, exposure and developing. In some embodiments, the mask layer 418 is a hard mask, the patterning process in the operation 312 includes forming a patterned resist layer on the hard mask 418 using a lithography process; and etching the hard mask through the opening of the patterned resist layer using the patterned resist layer as an etch mask. After the formation of the patterned hard mask, the patterned resist layer may be removed by plasma ashing or wet stripping.

Figure 4G:
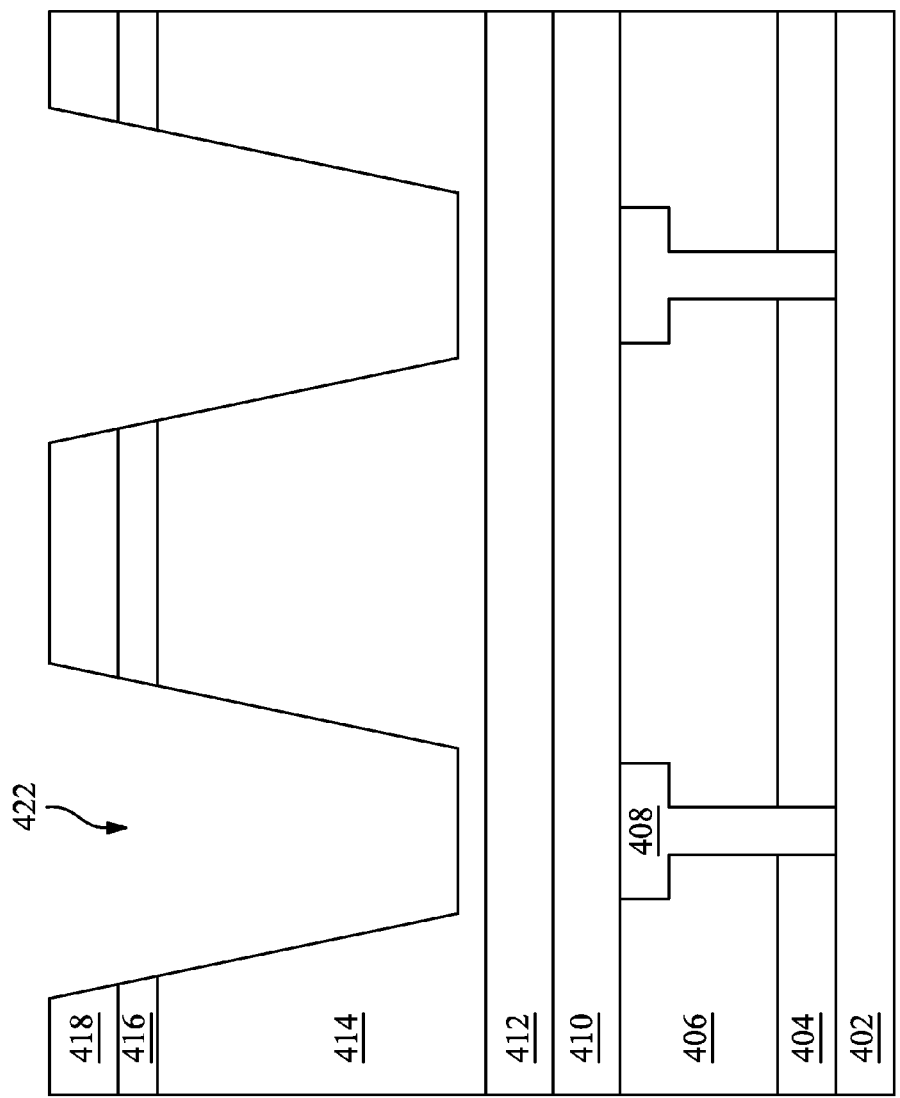

Referring to FIGS. 3 and 4G, method 300 proceeds to operation 314 where a via etching process is performed. The second dielectric material layer 414 and the ARC layer 416 is etched (or recessed) through openings 420 to form first trenches 422 (e.g., a via feature) that extend through patterned mask layer 418, the ARC layer 416, and the second dielectric material layer 414. First trenches are formed by performing a first etching process using the patterned resist layer 418 as an etch mask. The first etching process is designed and tuned to partially etch the second dielectric material layer 414 such that the first trenches 422 do not extend completely through the second dielectric material layer 414. For example, the second dielectric material layer 404 is etched to about half of its thickness. In some embodiments, the first etching process is controlled by the etching duration.

Figure 4H:
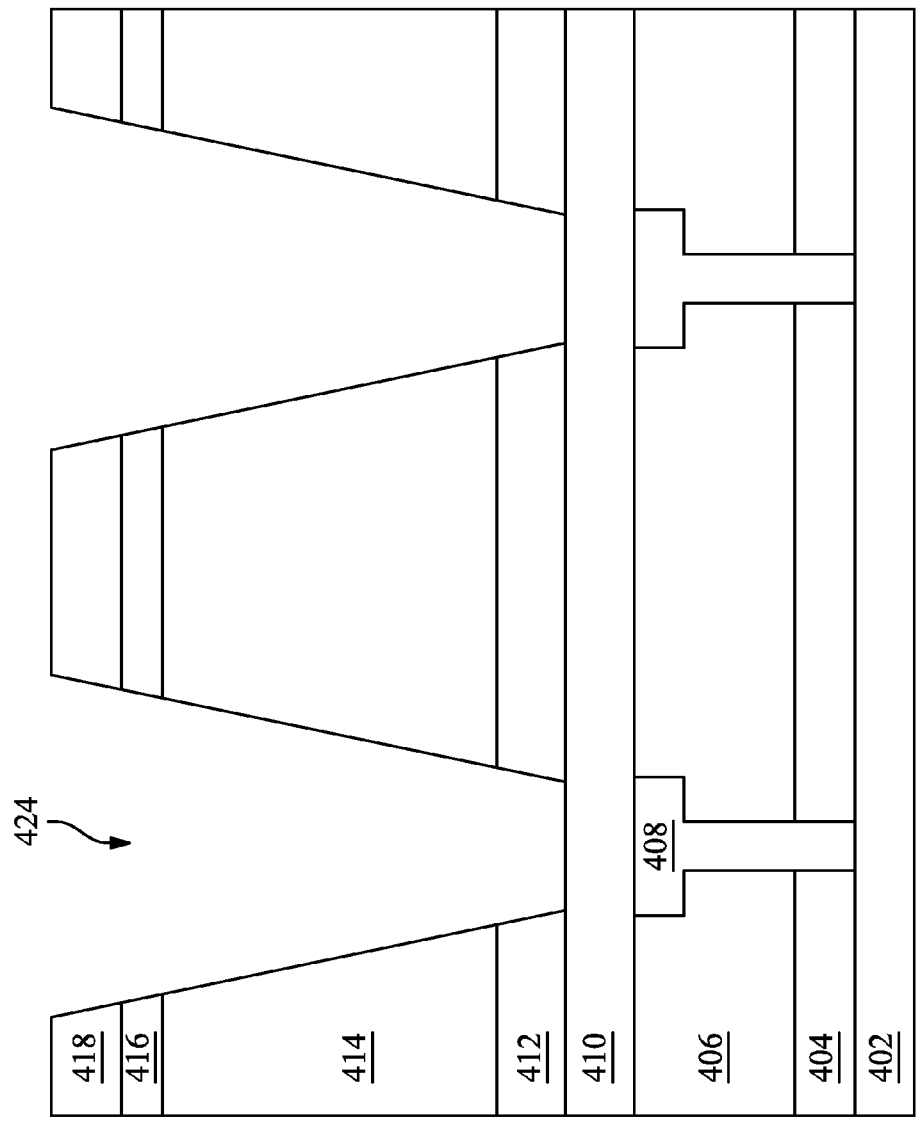
Figure 4I:
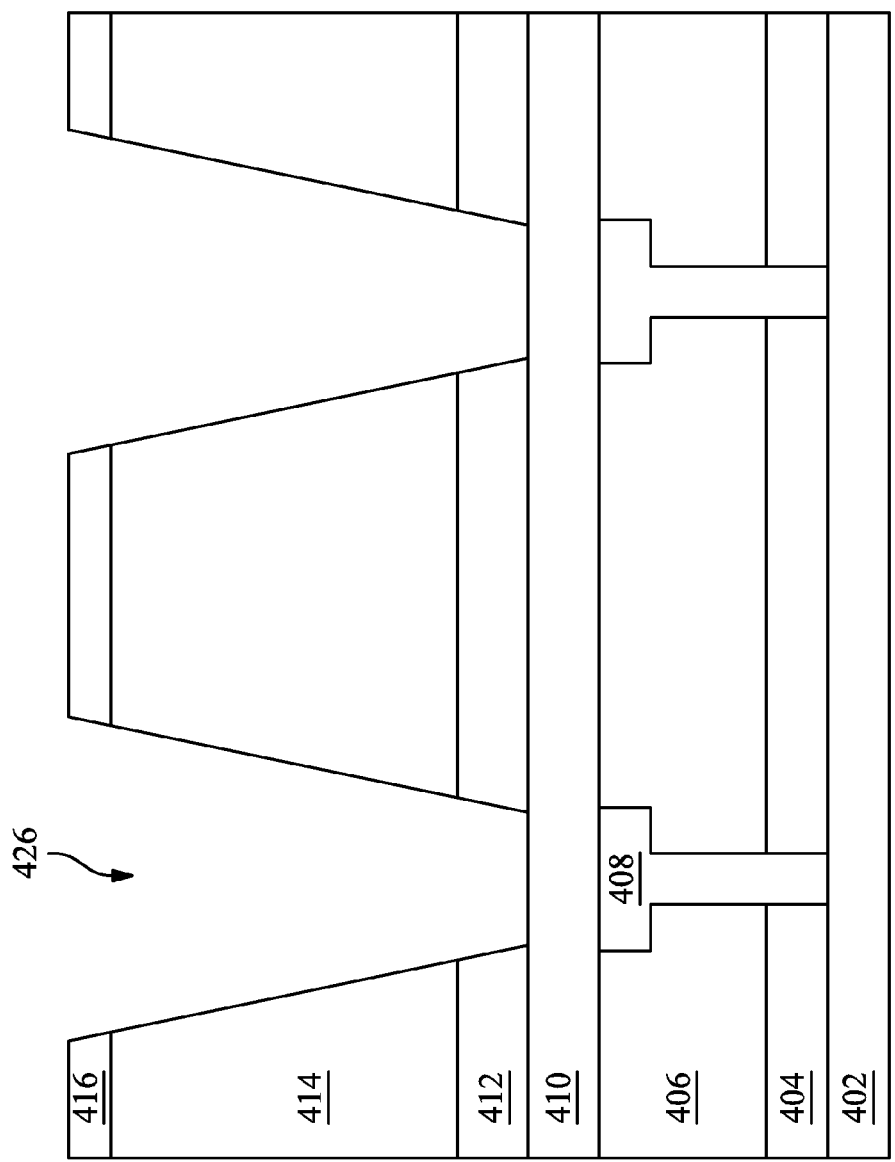

Referring to FIGS. 1 and 4H, method 300 proceeds to operation 316 where a trench etching process is performed. The second dielectric material layer 414 and the ARC layer 416 are further etched through opening 420 (shown in FIG. 4F) by a second etching process using the hard mask 418 as an etch mask. As a result of the second etching process, first trenches 422 ar enlarged to form second trenches 224. The second etching process is designed to selectively etch the second dielectric material layer 414 while the second ESL 412 substantially remains intact.

In some embodiments, the second etching process includes dry etch, wet etch and/or a combination thereof. The second etching process is designed with an etchant to have etching selectivity such that the second etching process substantially removes the second dielectric material layer 414 while keeping the second ESL 412 intact. In some embodiments, the second etching process is a dry etch with more etching directionality. In some embodiments, the etchant in the second etching process includes fluorine-containing gas (such as CxFy, which x and y are proper integers), oxygen-containing gas (such as O2), other suitable etching gas and/or a combination thereof.

After the formation of the second trench 424, method 300 proceeds to operation 318 with applying a third etching process to etch the second ESL 412 to form a third trench 226. More specifically, the third etching process may include applying a solution to the IC structure 400 that simultaneously removes the patterned mask layer 418, removes residues distributed along sidewall(s) of third trench 426, and selectively etches the second ESL 412 while keeping the first ESL 410 intact. The solution includes a first component and a second component. In some embodiments, the first component includes: Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, and/or 1-Acetylguanidine; the second component includes: Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol)bis(amine), (2-Methylbutyl)amine, Tris(2-ethylhexyl)amine, (4-Isothiocyanatophenyl)(3-methylphenyl)amine, and/or Poly(ethylene glycol)methyl ether amine, Poly(ethylene glycol)diamin. In some specific embodiments, the first component is configured to etch the second ESL layer 412 and/or the patterned mask layer 418; the second component is configured to remove residues distributed along sidewall(s) of opening feature 426.

Figure 4J:
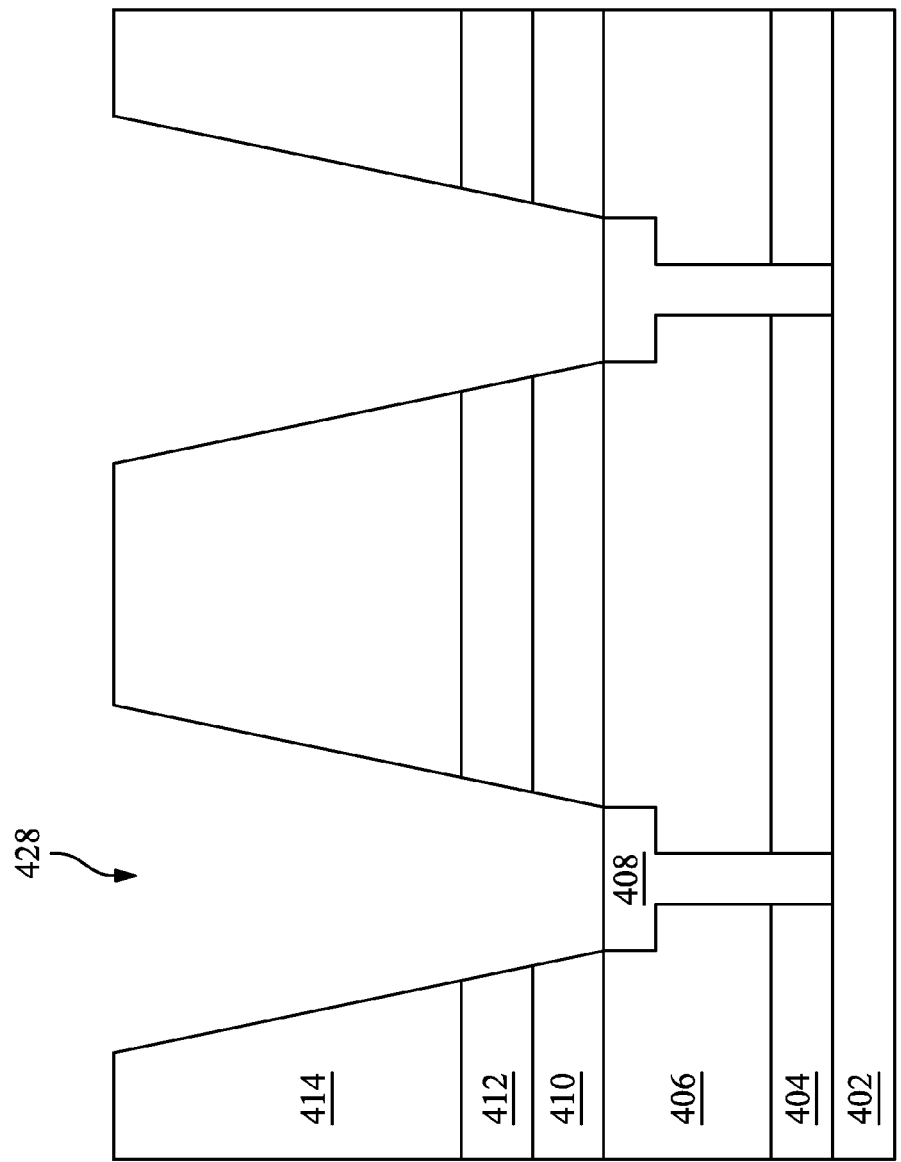

Referring now to FIGS. 3 and 4J, the method 300 proceeds to operation 320 with performing a fourth etching process to remove the ARC layer 416 and etch the first ESL layer 410 to thereby form a fourth trench 428. In some specific embodiments, the fourth etching process may be referred to as a "liner removal process." Generally, the fourth etching process may include a dry etching process such as using a fluorine-containing gas, oxygen-containing gas, and/or a combination thereof as an etchant. In some alternative embodiments, the fourth etching process may include a wet stripping and/or plasma ashing process.

Figure 4K:
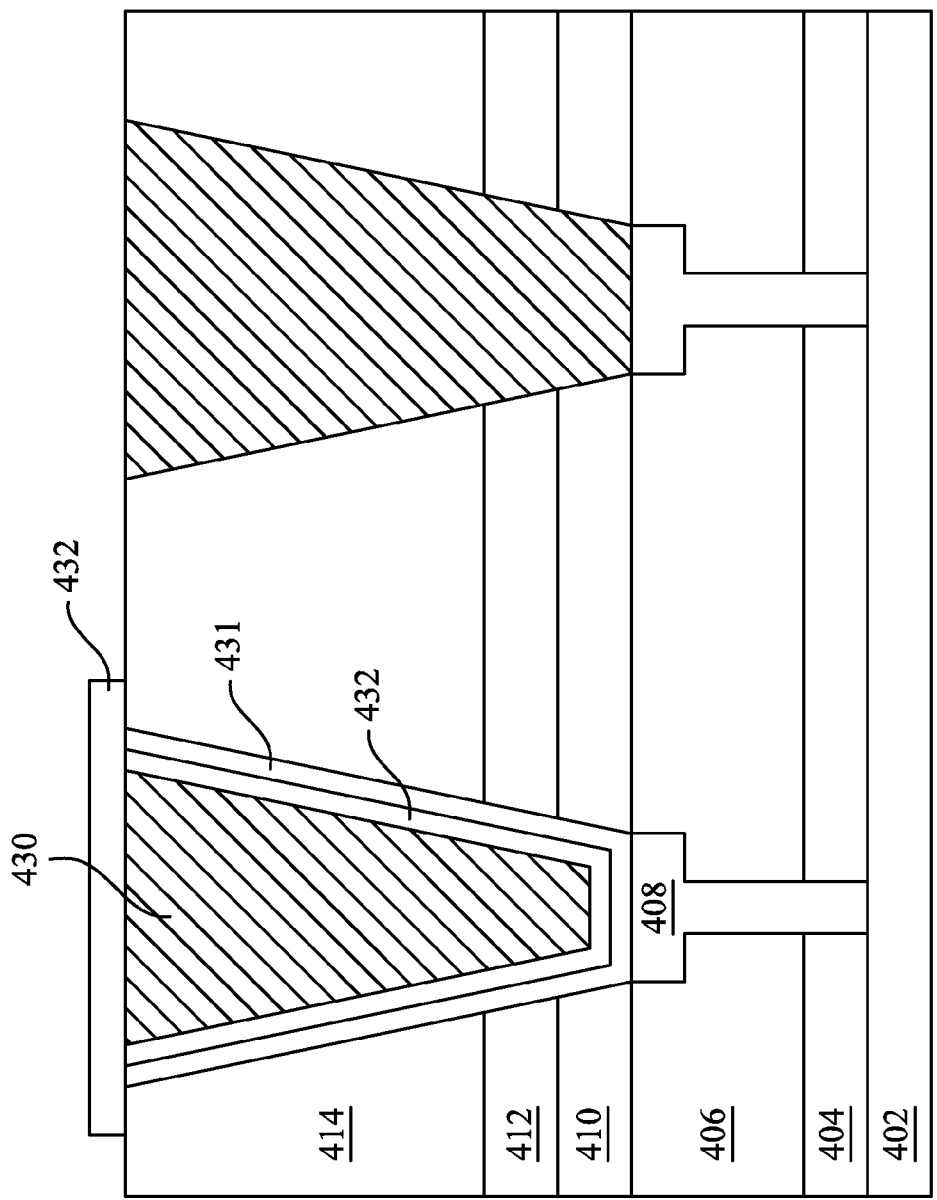

Referring to FIGS. 3 and 4K, method 300 proceeds to operation 322 with forming a conductive feature 430 in the third trench 428. In some embodiments, the conductive feature 430 may include a via and/or a trench that is configured to electrically couple a subsequently formed conductive feature 432 (e.g., a metal line, a contact, an interconnect layer, etc.) to the underlying conductive feature 408. In various embodiments, the conductive feature 430 is formed of a conductive material that includes copper, aluminum, cobalt or tungsten. In some other embodiments, the conductive material may include titanium, polysilicon, metal silicide, metal alloy, and/or combinations thereof. In some embodiments, the conductive feature 430 is similar to the underlying conductive feature 408 in terms of composition and formation. In the present embodiment, the conductive feature 430 includes copper and has multiple films. In one example, the conductive feature 430 is formed by a procedure that includes: depositing a barrier layer 431 on sidewalls of the opening feature 428; forming a copper seed layer 432 by sputtering; and filling the copper material (e.g., 430) in the remaining portion of fourth trench 428 by plating. The barrier layer may include titanium, titanium nitride, tantalum, tantalum nitride, other suitable material, and/or a combination thereof; and may be formed by sputtering. Afterward, a CMP process may be applied to remove excessive copper and planarize the top surface before forming the conductive feature 432.

As such, using the solution to form the opening feature 426 may include a variety of advantages over the conventional approaches, which is similar to using the solution to form the opening feature 226 as described above. Furthermore, since in the embodiment of the IC structure 400 formed by the method 300 includes a top ESL layer that is formed of a high-k dielectric material (i.e., 412), the underlying conductive feature 408 may be protected by the bottom ESL layer (i.e., 410) during the applying the solution to form the opening process 226 and to simultaneously removing the patterned mask layer 418.

The present disclosure provides a method of fabricating an integrated circuit in accordance with some embodiments. The method includes providing a substrate having a first conductive feature in a first dielectric material layer; forming a first etch stop layer on the first dielectric material layer, wherein the first etch stop layer is formed of a high-k dielectric material; forming a second etch stop layer on the first etch stop layer; forming a second dielectric material layer on the second etch stop layer; forming a pattered mask layer on the second dielectric material layer; forming a first trench in the second dielectric material layer and the second etch stop layer; removing a portion of the first etch stop layer through the first trench to thereby form a second trench, wherein removing the portion of the first etch stop layer includes applying a solution to the portion of the first etch stop layer; and forming a second conductive feature in the second trench, wherein the second conductive feature is electrically connected to the first conductive feature.

The present disclosure provides a method of fabricating an integrated circuit in accordance with some embodiments. The method includes providing a substrate having a first conductive feature in a first dielectric material layer; forming a first etch stop layer on the first dielectric material layer; forming a second etch stop layer on the first etch stop layer, wherein the second etch stop layer is formed of a high-k dielectric material; forming a second dielectric material layer on the second etch stop layer; forming a pattered mask layer on the second dielectric material layer; forming a first trench in the second dielectric material layer; removing a portion of the second etch stop layer through the first trench to thereby form a second trench, wherein removing the portion of the second etch stop layer includes applying a solution to the portion of the second etch stop layer; removing a portion of the first etch stop layer through the second trench to thereby form a third trench; and forming a second conductive feature in the third trench, wherein the second conductive feature is electrically connected to the first conductive feature.

The present disclosure provides an integrated circuit structure in accordance with some embodiments. The integrated circuit structure includes a first dielectric material layer on a substrate; an underlying conductive feature disposed in the first dielectric material layer; a first etch stop layer disposed on the first dielectric material layer and the underlying conductive feature, wherein the first etch stop layer is a high-k dielectric layer; a second dielectric material layer located on the first etch stop layer; and an overlying conductive feature formed in the second dielectric material layer and the first etch stop layer, landing on the underlying conductive feature, and electrically connected to the underlying conductive feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
providing a substrate having a first conductive feature in a first dielectric material layer;
forming a first etch stop layer on the first dielectric material layer, wherein the first etch stop layer is formed of a high-k dielectric material;
forming a second etch stop layer on the first etch stop layer;
forming a second dielectric material layer on the second etch stop layer;
forming a patterned mask layer on the second dielectric material layer;
forming a first trench in the second dielectric material layer and the second etch stop layer;
removing a portion of the first etch stop layer through the first trench to thereby form a second trench, wherein removing the portion of the first etch stop layer includes applying a solution to the portion of the first etch stop layer to remove the portion of the first etch stop layer and form a protective layer on the first conductive feature; and
forming a second conductive feature in the second trench, wherein the second conductive feature is electrically connected to the first conductive feature.

2. The method of claim 1, wherein providing the substrate includes:
depositing the first dielectric material layer on the substrate;
forming a third trench in the first dielectric material layer;
filling a metal in the third trench; and
performing a chemical mechanical polishing (CMP) process to the metal and first dielectric material layer such that a top surface of the first conductive feature is substantially coplanar with a top surface of the first dielectric material layer.

3. The method of claim 1, wherein applying the solution to the portion of the first etch stop layer further includes:
applying the solution to the patterned mask layer to remove the patterned mask layer;
removing the portion of the first etch stop layer to expose a portion of a top surface of the first conductive feature by using a first component of the solution;
removing a residue on a sidewall of the first trench by using a second component of the solution; and
forming the protective layer on the exposed portion of the top surface of the first conductive feature.

4. The method of claim 3, wherein the second component of the solution includes: Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol)bis(amine), (2-Methylbutyl)amine, Tris(2-ethylhexyl)amine, (4-Isothiocyanatophenyl)(3-methylphenyl)amine, and/or Poly(ethylene glycol) methyl ether amine, Poly(ethylene glycol)diamin.

5. The method of claim 3, wherein the protective layer includes: 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, and/or BTA-like.

6. The method of claim 3, wherein the first component of the solution includes: Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, and/or 1-Acetylguanidine.

7. The method of claim 3 further comprising removing the protective layer before forming the second conductive feature in the second trench.

8. The method of claim 7, wherein removing the protective layer includes applying IPA, DMSO, DMF, diluted HCl, $NH_4OH$, diluted HF, or a combination thereof on the protective layer.

9. The method of claim 1, wherein forming the first trench in the second dielectric material layer and the second etch stop layer includes using fluorine-containing gas, oxygen-containing gas, or a combination thereof as an etchant.

10. A method comprising:
providing a substrate having a first conductive feature in a first dielectric material layer;
forming a first etch stop layer on the first dielectric material layer;
forming a second etch stop layer on the first etch stop layer, wherein the second etch stop layer is formed of a high-k dielectric material;
forming a second dielectric material layer on the second etch stop layer;

forming a patterned mask layer on the second dielectric material layer;
forming a first trench in the second dielectric material layer;
removing a portion of the second etch stop layer through the first trench to thereby form a second trench, wherein removing the portion of the second etch stop layer includes applying a solution to the portion of the second etch stop layer, wherein applying the solution to the portion of the second etch stop layer includes:
applying the solution to the patterned mask layer to remove the patterned mask layer;
removing a portion of the second etch stop layer thereby exposing a portion of a top surface of the first etch stop layer by using a first component of the solution; and
removing a residue on a sidewall of the first trench by using a second component of the solution;
removing a portion of the first etch stop layer through the second trench to thereby form a third trench; and
forming a second conductive feature in the third trench, wherein the second conductive feature is electrically connected to the first conductive feature.

11. The method of claim 10, wherein providing the substrate includes:
depositing the first dielectric material layer on the substrate;
forming a fourth trench in the first dielectric material layer;
filling a metal in the fourth trench; and
performing a chemical mechanical polishing (CMP) process to the metal and first dielectric material layer such that a top surface of the first conductive feature is substantially coplanar with a top surface of the first dielectric material layer.

12. The method of claim 10, wherein the first component of the solution includes: Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, and/or 1-Acetylguanidine.

13. The method of claim 10, wherein the second component of the solution includes: Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol)bis(amine), (2-Methylbutyl) amine, Tris(2-ethylhexyl)amine, (4-Isothiocyanatophenyl) (3-methylphenyl)amine, and/or Poly(ethylene glycol) methyl ether amine, Poly(ethylene glycol)diamin.

14. The method of claim 10, wherein removing the portion of the first etch stop layer through the second trench to thereby form the third trench includes applying a fluorine-containing gas, an oxygen-containing gas, or a combination thereof as an etchant.

15. The method of claim 10, wherein the first etch stop layer and the second etch stop layer each includes a thickness that is less than about 5 angstroms.

16. The method of claim 10, wherein the second etch stop layer is formed of a different material than the first etch stop layer.

17. A method comprising:
providing a substrate having a first conductive feature disposed in a first dielectric material layer;
forming a high-k dielectric layer directly on the first conductive feature;
forming an etch stop layer on the high-k dielectric layer;
forming a second dielectric material layer on the etch stop layer;
forming a first trench in the second dielectric material layer and the etch stop layer;
etching a portion of the high-k dielectric layer through the first trench to thereby form a second trench such that the etching removes the portion of the high-k dielectric layer and forms a protective layer directly on the first conductive feature; and
forming a second conductive feature in the second trench, wherein the second conductive feature is electrically connected to the first conductive feature.

18. The method of claim 17, further comprising forming an anti-reflective coating layer on the second dielectric material layer, and
wherein forming the first trench in the second dielectric material layer and the etch stop layer includes forming the first trench in the anti-reflective coating layer.

19. The method of claim 18, further comprising removing the anti-reflective coating layer after etching the portion of the high-k dielectric layer through the first trench to thereby form the second trench.

20. The method of claim 17, further comprising removing the protective layer prior to forming the second conductive feature in the second trench.

* * * * *